US012754013B2

(12) United States Patent
Chu et al.

(10) Patent No.: US 12,754,013 B2
(45) Date of Patent: Oct. 6, 2026

(54) TECHNIQUES FOR IMPROVED CRITICAL DIMENSION METROLOGY

(71) Applicant: UCHICAGO ARGONNE, LLC, Chicago, IL (US)

(72) Inventors: Miaoqi Chu, Naperville, IL (US); Jin Wang, Hinsdale, IL (US); Zhang Jiang, Naperville, IL (US)

(73) Assignee: UCHICAGO ARGONNE, LLC, Chicago, IL (US)

( * ) Notice: Subject to any disclaimer, the term of this patent is extended or adjusted under 35 U.S.C. 154(b) by 205 days.

(21) Appl. No.: 18/762,209

(22) Filed: Jul. 2, 2024

(65) Prior Publication Data

US 2026/0009636 A1 Jan. 8, 2026

(51) Int. Cl.

*G01B 11/24* (2006.01)
*G01B 15/04* (2006.01)
*G03F 7/00* (2006.01)

(52) U.S. Cl.

CPC .............. *G01B 11/24* (2013.01); *G01B 15/04* (2013.01); *G03F 7/70625* (2013.01);
(Continued)

(58) Field of Classification Search

CPC ........... G01B 11/24; G01B 15/04; G03F 7/00; G03F 7/70625; G03F 7/70655;
(Continued)

(56) References Cited

U.S. PATENT DOCUMENTS

| | | | | |
|---|---|---|---|---|
| 7,920,676 B2 * | 4/2011 | Yun | G01N 23/201 | 378/70 |
| 8,520,212 B2 * | 8/2013 | Coene | G01N 21/55 | 356/445 |

(Continued)

FOREIGN PATENT DOCUMENTS

WO WO-2015/167753 A2 11/2015

OTHER PUBLICATIONS

Chu et al., Probing three-dimensional mesoscopic interfacial structures in a single view using multibeam X-ray coherent surface scattering and holography imaging, Nat. Comm., 14: 5795 (2023).

(Continued)

*Primary Examiner* — Jurie Yun

(57) ABSTRACT

Techniques for improving critical dimension metrology are disclosed herein. An example method includes emitting a radiation beam comprising (i) a primary beam that passes through a sample and scatters into a set of scattered beams and (ii) a reference beam. The method further includes detecting the reference beam and a portion of the set of scattered beams, wherein the reference beam and the portion of the set of scattered beams superimpose at the detector as a hologram of the sample to encode structural information associated with at least one lithographic pattern of the sample. The method further includes executing a dimensioning algorithm configured to: determine one or more critical dimensions of the sample based on one or more properties of the hologram and reconstruct a real-space image of the sample based on the hologram. The method further includes causing the critical dimensions or the real-space image to be displayed.

20 Claims, 17 Drawing Sheets

(52) U.S. Cl.
CPC .... *G03F 7/70655* (2023.05); *G03F 7/706837* (2023.05); *G03F 7/706839* (2023.05); *G03F 7/706847* (2023.05)

(58) Field of Classification Search
CPC ......... G03F 7/706837; G03F 7/706839; G03F 7/706847
See application file for complete search history.

(56) References Cited

U.S. PATENT DOCUMENTS

| | | | | |
|---|---|---|---|---|
| 9,175,951 | B2 * | 11/2015 | El Gawhary | G03F 7/70625 |
| 9,846,132 | B2 | 12/2017 | Bakeman et al. | |

OTHER PUBLICATIONS

Deng et al., Experimental demonstration of the mechanism of steady-state microbunching, Nature, 590: 576-579 (2021).
Jørgensen et al., Hard x-ray grazing-incidence ptychography: large field-of-view nanostructure imaging with ultra-high surface sensitivity, Optica, 11(2): 197-204 (2024).
Orji et al., Metrology for the next generation of semiconductor devices, Nature Electronics, 1: 532-547 (2018).
Sunday et al., Determining the shape and periodicity of nanostructures using small-angle X-ray scattering, J. Appl. Cryst., 48: 1355-1363 (2015).
Tanksalvala et al., Nondestructive, high-resolution, chemically specific 3D nanostructure characterization using phase-sensitive EUV imaging reflectometry, Sci. Adv., 7: eabd9667 (Jan. 2021).

* cited by examiner

TECHNIQUES FOR IMPROVED CRITICAL DIMENSION METROLOGY

STATEMENT REGARDING FEDERALLY SPONSORED RESEARCH OR DEVELOPMENT

This invention was made with government support under Contract No. DE-AC02-06CH11357 awarded by the United States Department of Energy to UChicago Argonne, LLC, operator of Argonne National Laboratory. The government has certain rights in the invention.

TECHNICAL FIELD

The present disclosure generally relates to metrology, and more particularly, to improved critical dimension metrology for extreme ultraviolet (EUV) lithography masks and wafers using holographic scattering and imaging techniques coupled with a dimensioning algorithm configured to reconstruct and analyze sample structures based on the sample hologram.

BACKGROUND

In recent years, the semiconductor industry has embraced EUV (e.g., ~13.5 nanometer (nm) wavelength) lithography (EUVL) for circuits with sub-10 nm gate lengths. As part of the manufacturing process of such circuits, high-precision metrology tools are required to measure critical dimensions (CDs, e.g., line 3D profile, roughness, and defects) of the lithography patterns and circuits and thereby ensure they will have the desired/intended performance characteristics. Importantly, high-precision metrology tools are required for up to 50% of the manufacturing process to ensure quality, reliability, performance, and yield.

However, conventional techniques for performing CD metrology suffer from several drawbacks when applied in the EUVL context. For example, many conventional techniques (e.g., EUV imaging and scattering), have resolution limits that disable such techniques from resolving CD features finer than 5 nm. Conventional metrology techniques also suffer from limitations, such as limited fields of view (FOVs) (e.g., lateral FOV), limited or no depth probing capability for buried structures (i.e., no three-dimensional (3D) sensitivity), yielding only statistical information, and/or requiring excessive sample preparation (e.g., milling, thinning). Overall, these conventional techniques lack the ability to provide reliable, precise measurements of pattern/circuit structures created using EUVL manufacturing processes.

Therefore, in general, CD metrology systems are an area of great interest, and conventional techniques are insufficient for providing reliable, precise, and non-destructive measurements of sub-10/5 nm structures. Accordingly, a need exists for techniques that can provide reliable, precise, and non-destructive images/measurements of sample internal structures at nanometer/sub-nanometer scales.

SUMMARY OF THE DISCLOSURE

In some aspects, a method for improved critical dimension metrology includes emitting, by an emitter, a radiation beam comprising (i) a primary beam that passes through a sample and scatters into a set of scattered beams and (ii) a reference beam, wherein the sample includes one or more lithographic patterns. The method further includes detecting, by a detector, the reference beam and a portion of the set of scattered beams. The reference beam and the portion of the set of scattered beams superimpose at the detector as a hologram of the sample to encode structural information associated with at least one lithographic pattern of the one or more lithographic patterns. The method further includes executing, by one or more processors, a dimensioning algorithm configured to: determine one or more critical dimensions of the sample based on one or more properties of the hologram and reconstruct a real-space image of the sample based on the hologram. The method further includes causing, by the one or more processors, the one or more critical dimensions or the real-space image to be displayed for viewing by a user.

In some aspects, a computer system for improved critical dimension metrology includes an emitter configured to emit radiation, a detector configured to detect the radiation, one or more processors, and one or more memories communicatively coupled with the one or more processors, the emitter, and the detector. The one or more memories store computer-executable instructions thereon that, when executed by the one or more processors, the instructions cause the system to: emit, by the emitter, a radiation beam comprising (i) a primary beam that passes through a sample and scatters into a set of scattered beams and (ii) a reference beam, wherein the sample includes one or more lithographic patterns; detect, by the detector, the reference beam and a portion of the set of scattered beams, wherein the reference beam and the portion of the set of scattered beams superimpose at the detector as a hologram of the sample to encode structural information associated with at least one lithographic pattern of the one or more lithographic patterns; execute a dimensioning algorithm configured to: determine one or more critical dimensions of the sample based on one or more properties of the hologram, and reconstruct a real-space image of the sample based on the hologram; and cause the one or more critical dimensions or the real-space image to be displayed for viewing by a user.

In some aspects, a non-transitory computer-readable storage medium includes instructions for improved critical dimension metrology that, when executed by one or more processors, cause the one or more processors to: receive a signal generated from a reference beam and a portion of a set of scattered beams that passed through a sample, wherein the reference beam and the portion of the set of scattered beams are superimposed as a hologram of the sample to encode structural information associated with at least one lithographic pattern of one or more lithographic patterns included on the sample; execute a dimensioning algorithm configured to: determine one or more critical dimensions of the sample based on one or more properties of the hologram, and reconstruct a real-space image of the sample based on the hologram; and cause the one or more critical dimensions or the real-space image to be displayed for viewing by a user.

BRIEF DESCRIPTION OF THE DRAWINGS

The Figures described below depict preferred embodiments for purposes of illustration only. One skilled in the art will readily recognize from the following discussion that alternative embodiments of the systems and methods illustrated herein may be employed without departing from the principles of the disclosure described herein.

DETAILED DESCRIPTION

Figure 1:
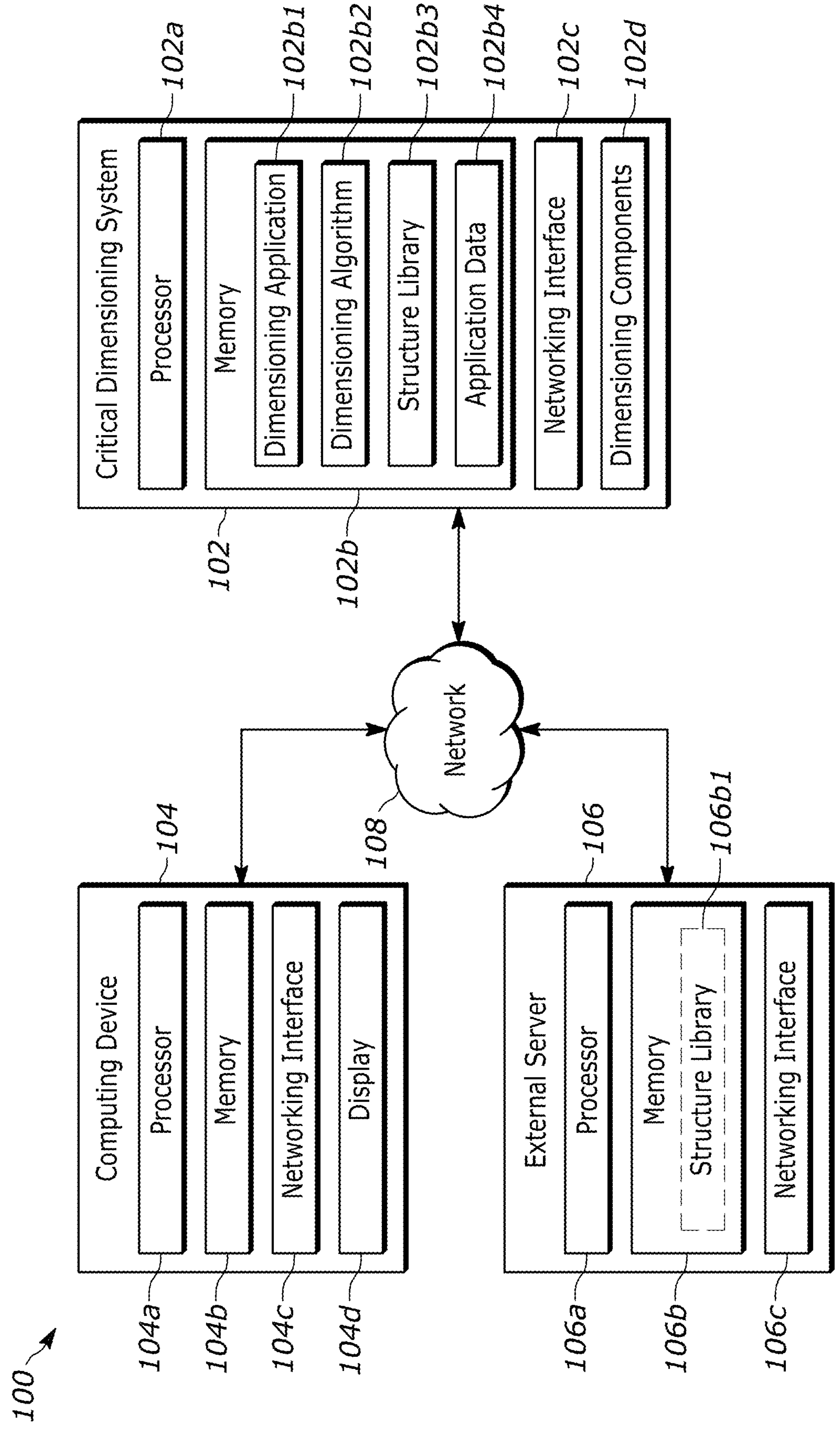
FIG. 1 is a block diagram of an example computing system for improving critical dimension metrology, in accordance with various embodiments described herein.

Broadly speaking, the techniques of the present disclosure relate to CD metrology using holographic imaging techniques and a dimensioning algorithm configured to determine sample structure CDs based on the sample hologram. The systems described herein generally emit radiation beams comprising (i) a primary beam that passes through a sample and scatters into a set of scattered beams and (ii) a reference beam. The sample (e.g., a lithographic mask, circuit, etc.) includes one or more lithographic patterns that may represent structures (e.g., gates). The systems described herein then detect these beams via a detector, where the reference beam and a portion of the scattered beams superimpose to create a hologram of the sample that encodes structural information of the sample. The systems described herein then execute the dimensioning algorithm to determine CDs of the sample and reconstruct a real-space image of the sample based on the hologram. The systems described herein also cause the CDs and/or the real-space image to be displayed for viewing.

As mentioned, conventional CD metrology techniques/tools generally suffer from an inability to provide precise, high-dimensional, and non-destructive CDs of samples prepared in accordance with EUVL and/or other nm/sub-nm dimension manufacturing processes. For example, conventional CD scanning electron microscopy provides two-dimensional (2D), top-down images within a limited FOV, which significantly limits its application in macroscopic sample sizes (e.g., several inches) and provides little to no three-dimensional (3D) sensitivity for samples (e.g., EUVL masks, wafers) with surface planar structures. Conventional visible wavelength (e.g., 400-800 nm) approaches have a necessarily limited resolution to approximately 150 nm, which is completely insufficient to resolve sub-10 nm structures. Conventional transmission X-ray techniques require samples free from the underlying substrate to avoid strong attenuation of the probing X-rays, thereby requiring thinning and/or micromachining the substrate and consequently disabling high-throughput metrology. Other conventional techniques suffer from similar challenges, such that no conventional technique is capable of providing high-resolution (precise), 3D sensitive images/measurements of sample structures without destructively interfering with the sample substrate.

To overcome these issues faced by conventional systems, the present techniques utilize holographic imaging and sample reconstruction to determine sample CDs. By emitting (i) radiation beams that scatter by passing through a sample and (ii) a reference beam, the detected superposition of those beams creates a hologram of the sample that encodes structural information that conventional techniques were either completely unable to collect or unable to collect without destructively interfering with the underlying substrate. In particular, due to the scattering properties of the present configurations, the hologram of the sample is intricately 3D sensitive, even in a single projection direction, which was not possible using conventional techniques. The hologram is further analyzed to determine the CDs of the sample and to reconstruct a real-space image of the sample with nm/sub-nm resolution, which conventional techniques are generally unable to achieve.

In certain embodiments, the present techniques utilize X-rays for the radiation beam to further enhance the sensitivity relative to conventional techniques. Generally, the relatively short wavelengths of X-rays provide significantly higher resolution capabilities than visible light, while also providing substantially higher penetration power to characterize interior sample structures that conventional techniques are incapable of capturing. On surfaces (e.g., substrate surface), the radiation beam passing through the sample creates an X-ray standing wave resulting from the interference between the incident beam and the reflected beam. This position-sensitive standing wave is typically orders of magnitude stronger than the unperturbed incident wave, and correspondingly increases the scattering intensity required for effective imaging. Moreover, waves reflected from the substrate create a hologram that probe the sample from multiple directions, particularly in the direction perpendicular to the substrate, resulting in even greater 3D sensitivity than was possible using conventional techniques.

The techniques of the present disclosure also improve the functionality of a computing device (e.g., a critical dimensioning system) at least by using a dimensioning algorithm in a particular way to enhance the intelligence of the computing device. This algorithm, executing on the computing device, can more accurately determine 3D CDs of nm/sub-nm scale objects without requiring any additional mask/wafer preparation (e.g., machining, adjustments, thinning, milling, etc.) than was possible using conventional techniques. That is, the present disclosure describes improvements in the functioning of the computer itself because the computing device can more accurately determine CDs. This improves over the prior art at least because existing systems completely lack such nm/sub-nm, 3D precision without further machining the substrate.

Moreover, the present disclosure includes effecting a transformation or reduction of a particular article to a different state or thing, e.g., reducing/eliminating the inaccuracies of a computing system (and associated subsystems/components/devices) from a non-optimal or error state (e.g., lack of resolution, missing internal structures) to an optimal (or closer to optimal) state by executing a dimensioning algorithm to determine CDs and a real-space image of a sample based on a hologram of the sample.

Still further, the present disclosure includes specific features other than what is well-understood, routine, conventional activity in the field, or adding unconventional steps that demonstrate, in various embodiments, particular useful applications, e.g., emitting, by an emitter, a radiation beam comprising (i) a primary beam that passes through a sample and scatters into a set of scattered beams and (ii) a reference beam, wherein the sample includes one or more lithographic patterns; detecting, by a detector, the reference beam and a portion of the set of scattered beams, wherein the reference beam and the portion of the set of scattered beams superimpose at the detector as a hologram of the sample to encode structural information associated with at least one lithographic pattern of the one or more lithographic patterns; and/or executing, by one or more processors, a dimensioning algorithm configured to: determine one or more critical dimensions of the sample based on one or more properties of the hologram, and reconstruct a real-space image of the sample based on the hologram, among others.

Of course, it should be appreciated that the advantages and technical improvements described above and elsewhere herein are not the only advantages and/or technical improvements that may be realized as a result of the techniques described herein. Other advantages and/or technical improvements to the functioning of a computer itself or other technologies or technical fields may be apparent to one of ordinary skill in the art. Further, it should be understood that while this disclosure may refer to improving CD metrology within a microelectronics environment, the techniques of this disclosure can apply to metrology in any suitable system/industry.

Example Computing System

FIG. 1 is a block diagram of an example computing system 100 configured to implement the techniques of this disclosure for improving critical dimension metrology. It should be appreciated that the system 100 is merely an example and that alternative or additional components are envisioned. Depending on the embodiment, the example computing system 100 may determine one or more critical dimensions, reconstruct real-space images of a sample, and/or perform any other suitable actions or combinations thereof. Of course, it should be appreciated that, while the various components of the example computing system 100 (e.g., critical dimensioning system 102, computing device 104, external server 106, etc.) are illustrated in FIG. 1 as single components, the example computing system 100 may include multiple (e.g., dozens, hundreds, thousands) of computing devices 104 and external servers 106 that are simultaneously connected to the network 108 at any given time.

Generally, the example computing system 100 includes a critical dimensioning system 102, a computing device 104, and an external server 106. Each of the critical dimensioning system 102, the computing device 104, and the external server 106 may communicate with the other devices (e.g., transmit data, instructions, etc.) across the network 108. As an example, the critical dimensioning system 102 and the external server 106 may belong to a microelectronics manufacturer (e.g., manufacturing semiconductor chips) and the computing device 104 may belong to a user of the critical dimensioning system 102. In this example, an employee or other entity of the microelectronics manufacturer using the critical dimensioning system 102 may determine CDs and/or a real-space image of a sample. The critical dimensioning system 102 may execute a dimensioning application **102*b*1 and a dimensioning algorithm 102*b*2 to determine the CDs and/or real-space images. The critical dimensioning system 102 may also transmit the CDs and/or real-space image(s) to the computing device 104 for viewing by a user, such that the user may review the CDs and/or real-space images to review the CDs/images, update the structure library 102*b*3, and/or any other suitable actions or combinations thereof. As part of determining the CDs and/or the real-space image(s), the critical dimensioning system 102 may access the external server 106 to retrieve data from the server 106 (e.g., from structure library 106*b*1**).

More specifically, the critical dimensioning system 102 includes one or more processors **102*a*, the memory 102*b*, and a networking interface 102*c*. The memory 102*b* stores executable instructions that are configured to, when executed by the one or more processors 102*a*, cause the one or more processors 102*a* to analyze data (e.g., emitted radiation beams) and output various values (e.g., CDs and/or real-space images of samples). The dimensioning application 102*b*1, the dimensioning algorithm 102*b*2, the structure library 102*b*3, and the application data 102*b*4 may all include such executable instructions, as well as other data. The memory 102*b* may also store additional data and/or databases. It should be appreciated that the critical dimensioning system 102 can include one or multiple computing devices that are co-located or distributed. Additionally, in certain embodiments, the dimensioning application 102*b*1 includes the dimensioning algorithm 102*b*2**.

The critical dimensioning system 102 also includes a set of dimensioning components **102*d* that are generally configured to emit and detect radiation that is at least partially oriented to transmit through, scatter off of, reflect from, and/or otherwise interact with a sample. In certain embodiments, the sample is a silicon wafer substrate or a mask blank with one or more lithographic patterns, masks, circuits, and/or other structures or combinations thereof fabricated onto a surface of the substrate. The set of dimensioning components 102*d* thus provide the data (e.g., detected radiation) for processing by the processor 102*a* by executing the various applications (e.g., 102*b*1), algorithms (e.g., 102*b*2), and/or other modules or instructions (e.g., 102*b*3, 102*b*4) contained in the memory 102*b*1. In certain embodiments, the dimensioning components 102*d*** include an emitter configured to emit radiation (e.g., X-ray radiation beams), a detector configured to detect the radiation, diagnostic/alignment equipment configured to determine alignment adjustments for the sample, a high-precision sample manipulation stage to physically adjust the sample position into alignment with the emitter/detector, and/or optical components configured to manipulate the emitted and/or received radiation for the emitter/detector.

More specifically, the dimensioning components **102*d* receive data associated with a sample, and the processors 102*a* process the data in accordance with one or more sets of instructions stored in the memory 102*b* to output any of the values described herein. The critical dimensioning system 102 executes the dimensioning application 102*b*1, which in turn, accesses and applies the dimensioning algorithm 102*b*2, the structure library 102*b*3, and/or the application data 102*b*4 to the data from the dimensioning components 102*d*. The data from the dimensioning components generally includes scattered radiation beams and reference radiation beams that are superimposed at a detector (not shown) of the dimensioning components 102*d***. These superimposed radiation beams form a hologram of the sample and encode structural information associated with at least one lithographic pattern of the sample. For example, a lithographic pattern may generally represent one or more structures of a nano-circuit or mask that is intended to perform one or more functions, such as a field effect transistor (e.g., FinFET, GAAFET, etc.).

Based on this hologram, the dimensioning application **102*b*1 determines CDs of the sample and/or real-space images of the sample. For example, the dimensioning application 102*b*1 may execute the dimensioning algorithm 102*b*2 to evaluate the hologram and determine a line 3D profile, a roughness value, and/or defects corresponding to the sample. The real-space images of the sample may be 3D visual representations of the sample with dimensional values informed by the CDs. The critical dimensioning system 102** may transmit these real-space images to the computing device 104 for display to a user (e.g., via display 104*d*). Some/all of this information may eventually be stored in the application data 102*b*4 and/or stored in an external storage location (e.g., external server 106).

In certain embodiments, the dimensioning application 102*b*1 receives the data from the dimensioning components 102*d* and determined CDs and/or real-space images of samples by accessing/applying the structure library 102*b*3 and the dimensioning algorithm 102*b*2 to the data. The structure library 102*b*3 generally includes predetermined structure files of nanoscale components (e.g., transistors) that may be included in a sample. The pre-determined structure files may include structure dimensions and/or scattering signatures associated with one or more structures to be included on a sample. In these embodiments, the dimensioning algorithm 102*b*2 may utilize the data from the dimensioning components 102*d* and one or more predetermined structure files from the structure library 102*b*3 as inputs to determine CDs of the sample.

More generally, the computing device 104 is or includes any device that is associated with (e.g., owned and/or operated by) a particular entity that may provide a sample that is analyzed by the critical dimensioning system 102 and/or the external server 106 through the network 108. In some embodiments, the computing device 104 is a server or collection of servers. However, in certain embodiments, the computing device 104 is a personal computing device of that entity/user, such as a smartphone, a tablet, smart glasses, or any other suitable device or combination of devices (e.g., a smart watch plus a smartphone) with wireless communication capability. In the embodiment of FIG. 1, the computing device 104 includes a processor 104*a*, a memory 104*b*, a networking interface 104*c*, and a display 104*d*.

The computing device 104 is communicatively coupled to the critical dimensioning system 102 and/or the external server 106. For example, the computing device 104, the critical dimensioning system 102, and/or the external server 106 may communicate via USB, Bluetooth, Wi-Fi Direct, Near Field Communication (NFC), etc. For example, the critical dimensioning system 102 may transmit CDs, real-space images of a sample, and/or any other values or combinations thereof to the computing device 104 via the networking interface 102*c*, which the computing device 104 may receive via the networking interface 104*c*.

The external server 106 may be or include computing servers and/or combinations of multiple servers storing data that may be accessed/retrieved by the critical dimensioning system 102 and/or the computing device 104. In certain embodiments, the external server 106 receives data from the critical dimensioning system 102 and/or the computing device 104 and retrieves/accesses information stored in memory 106*b* for transmission back to the critical dimensioning system 102 and/or the computing device 104. The external server 106 may include a processor 106*a*, a memory 106*b*, and a networking interface 106*c*. It should be appreciated that the external server 106 can include one or multiple computing devices that are co-located or distributed.

Further, in certain embodiments, the external server 106 includes a structure library 106*b*1 including predetermined structure files, as described herein. In one such example, the external server 106 is a server located in and/or otherwise associated with a nano-electronic manufacturing entity, and the structure library 106*b*1 includes a plurality of predetermined structure files of various nanostructures that may be included as part of a sample. As another example, the external server 106 serves as a database for some or all of the application data 102*b*4. In some embodiments, the example computing system 100 does not include the external server 106.

Each of the processors 102*a*, 104*a*, 106*a* may include any suitable number of processors and/or processor types. For example, the processors 102*a*, 104*a*, 106*a* may each include one or more CPUs, one or more graphics processing units (GPUs), one or more field-programmable gate arrays (FPGAs), one or more application-specific integrated circuits (ASICs), and/or one or more data processing units (DPUs). Generally, each of the processors 102*a*, 104*a*, 106*a* may be configured to execute software instructions stored in each of the corresponding memories 102*b*, 104*b*, 106*b*. The memories 102*b*, 104*b*, 106*b* may each include one or more persistent memories (e.g., a hard drive and/or solid-state memory) and may store one or more applications, modules, and/or models, such as the dimensioning application 102*b*1.

The networking interface 102*c* may enable the critical dimensioning system 102 to communicate with the computing device 104, the external server 106, and/or any other suitable devices or combinations thereof. More specifically, the networking interface 102*c* enables the critical dimensioning system 102 to communicate with each component of the example computing system 100 across the network 108 through their respective networking interfaces 104*c*, 106*c*. The networking interfaces 102*c*, 104*c*, 106*c* may support wired or wireless communications, such as USB, Bluetooth, Wi-Fi Direct, Near Field Communication (NFC), etc. The networking interface 102*c* may enable the critical dimensioning system 102 to communicate with the various components of the example computing system 100 via a wireless communication network such as a fifth-, fourth-, or third-generation cellular network (5G, 4G, or 3G, respectively), a Wi-Fi network (802.11 standards), a WIMAX network, or any other suitable wide area network (WAN), local area network (LAN), or personal area net-work (PAN), etc.

Moreover, the network 108 may be a single communication network, or may include multiple communication networks of one or more types (e.g., one or more wired and/or PANs or LANs, and/or one or more WANs such as the Internet). In some embodiments, the network 108 includes multiple, entirely distinct networks (e.g., one or more networks for communications between critical dimensioning system 102 and computing device 104, and a separate, Bluetooth or wireless LAN (WLAN) network for communications between critical dimensioning system 102 and computing device 104, and so on).

It will be understood that the above disclosure is one example and does not necessarily describe every possible embodiment. As such, it will be further understood that alternate embodiments may include fewer, alternate, and/or additional steps or elements.

Example Dimensioning Component Configurations

FIGS. 2A-2H depict multiple dimensioning component configurations to improve critical dimension metrology, in accordance with various embodiments described herein. Each of these dimensioning component configurations illustrated and described in reference to FIGS. 2A-2H may include components and/or may comprise the dimensioning components 102*d* of FIG. 1. Of course, it should be understood that the example dimensioning component configurations of FIGS. 2A-2H may include additional or fewer components.

Figure 2A:
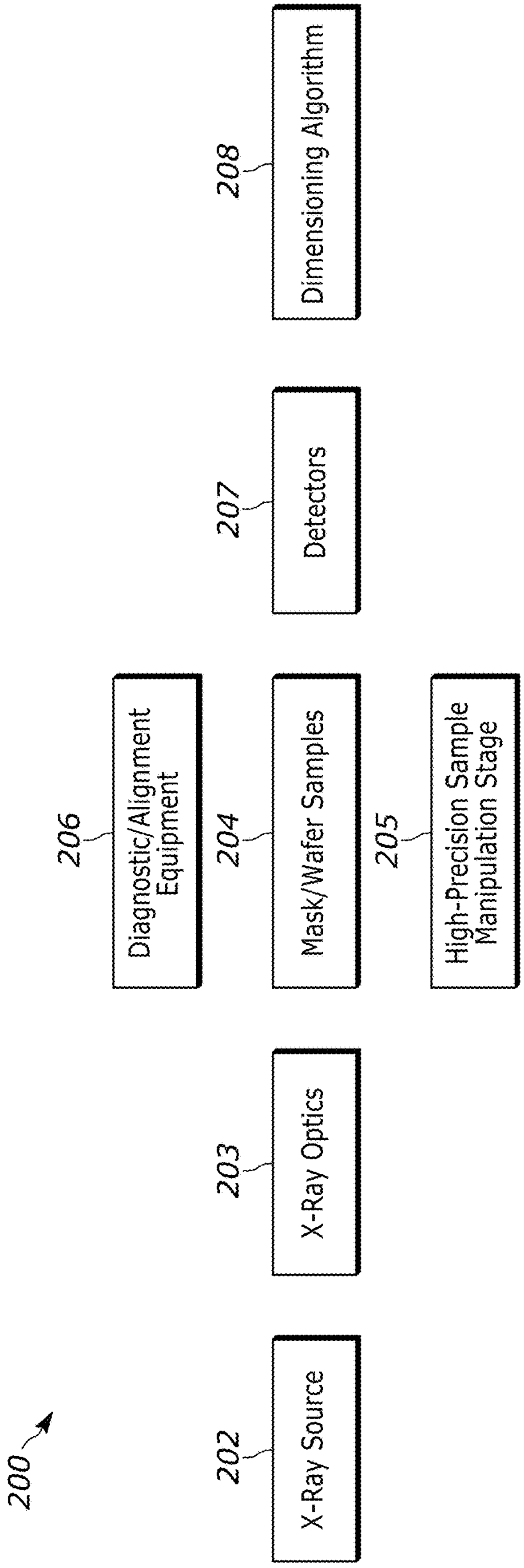
FIGS. 2A-2H depict multiple dimensioning component configurations to improve critical dimension metrology, in accordance with various embodiments described herein.

For example, FIG. 2A depicts an example dimensioning component configuration 200 for performing the CD metrology described herein. The example dimensioning component configuration 200 includes an X-ray source 202, X-ray optics 203, a sample 204, a high-precision sample manipulation stage 205, a diagnostic/alignment component 206, one or more detectors 207, and one or more dimensioning algorithms 208.

Broadly speaking, the example dimensioning component configuration 200 is configured to measure CDs of the sample 204 using the remaining components 202, 203, and 205-208. The X-ray source 202 (i.e., an "emitter") emits coherent X-rays that are optically manipulated (e.g., split, condensed, focused, etc.) by the X-ray optics 203 before reaching the sample 204. Ultimately, the emitted coherent X-rays will be split into a primary beam and a reference beam that form a hologram of at least a portion of the sample 204 at the one or more detectors 207. This splitting may occur at the X-ray optics 203 (e.g., via beam splitting) and/or may occur via scattering from a structure of the sample 204 and subsequent reflection from the sample 204 substrate, as described herein. In certain embodiments, the configuration 200 may additionally be configured to reconstruct a real-space (e.g., 3D) image associated with the sample 204 (e.g., based on the CDs).

The sample 204 is positioned in the optical path of the emitted coherent X-rays by the diagnostic/alignment component 206 which instructs and thereby causes the high-precision sample manipulation stage 205 to reposition the sample 204, as necessary. It should be appreciated that such repositioning/adjustment of the sample 204 takes place prior to the X-ray source 202 emitting coherent X-rays.

In any event, the primary beam and the reference beam of coherent X-rays reach the one or more detectors 207 by scattering from a structure (e.g., as part of a lithographic pattern) of the sample 204, reflecting from a substrate of the sample 204, without interacting with the sample 204, and/or in some other manner or combinations thereof. More specifically, at least a portion of the primary beam reaches the one or more detectors 207 by scattering due to interactions (e.g., passing/transmitting through/scattered by) with a structure of the sample 204. The reference beam reaches the one or more detectors 207 by scattering from a structure of the sample 204 and reflecting from the sample 204 substrate, without interacting with the sample 204, and/or any other optical path or combinations thereof. The scattered coherent X-rays of the primary beam reach the one or more detectors 207 and superimpose with the reference beam of coherent X-rays as a hologram of the sample 204. It should be appreciated that the hologram may be of a portion of the sample 204, such as a one or more individual structures fabricated onto the substrate of the sample 204. In certain embodiments, such fabrication of the structures is performed using EUVL.

Once the beams reach the one or more detectors 207, the dimensioning algorithms 208 analyze the properties of the hologram to determine CDs and/or reconstruct real-space images of the sample 204. The CDs may generally indicate any suitable dimensions or values of the sample 204, such as line 3D profiles, roughness values, defects, and/or other values or combinations thereof. For example, the sample 204 may include a structure representing an FET and the dimensioning algorithms 208 may determine that the FET has suitable 3D profiles, but that the roughness values indicate a major defect in a drain, such that the FET of the sample 204 will not have the desired performance characteristics (i.e., will not properly function as an FET). In this example, the CDs output by the dimensioning algorithms 208 may also represent and/or include estimations/predictions regarding the sample's 204 electrical properties, such as threshold voltage, channel conductivity, speed, power consumption, resistance, capacitance, signal propagation properties, and/or any other suitable performance metrics or combinations thereof.

Figure 2B:
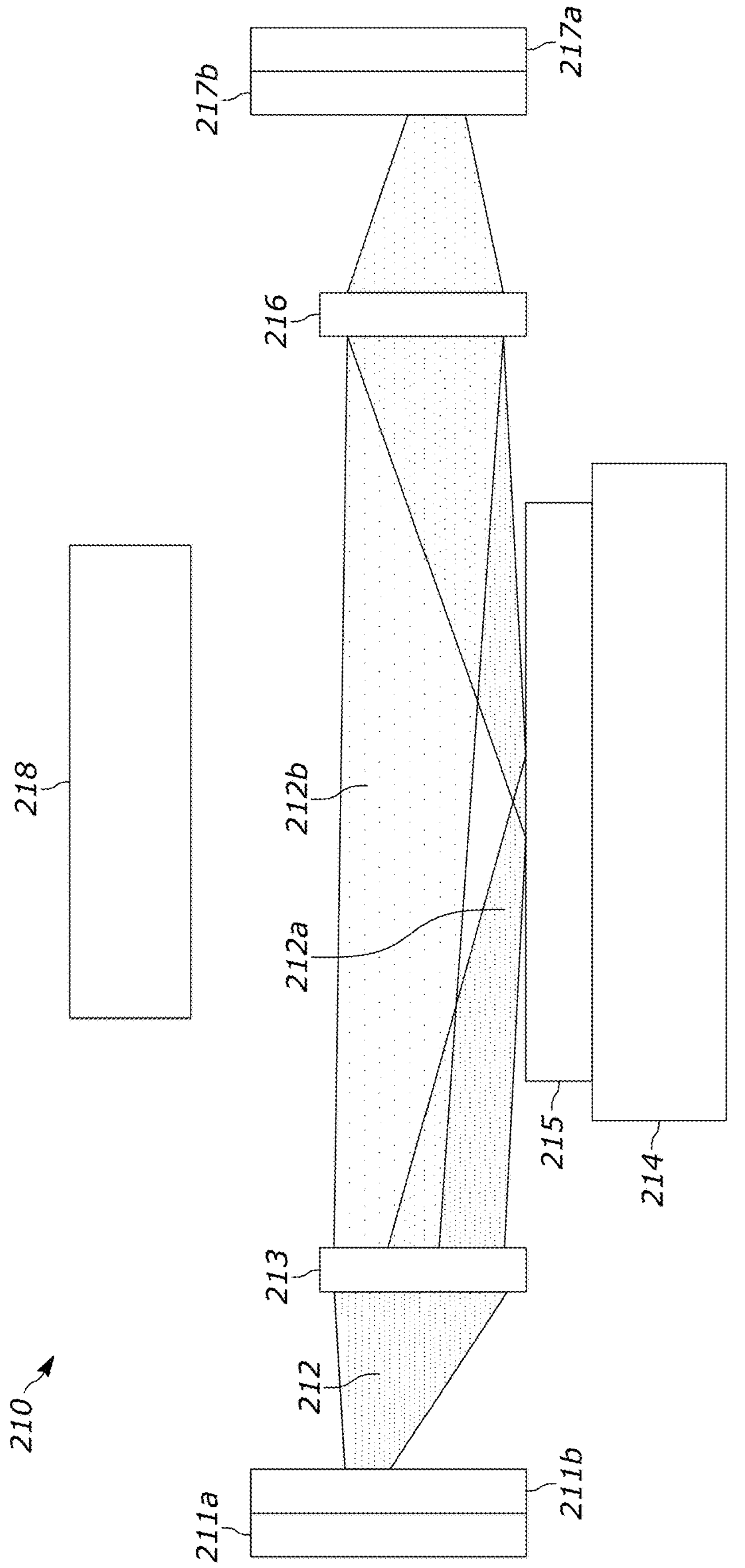

To provide a better understanding of various dimensioning component configurations discussed herein, FIGS. 2B-2H each provide an example configuration utilizing some/all components of the example dimensioning component configuration 200 of FIG. 2A. FIG. 2B depicts a first example configuration 210 that includes an emitter stage 211*a*, an emitter 211*b*, an emitted radiation beam 212, optics components 213, a primary beam 212*a*, a reference beam 212*b*, a multi-axis sample stage 214, a sample 215, conditioning optics 216, a detector stage 217*a*, a detector 217*b*, and an alignment device 218.

Broadly speaking, the emitter 211*b* emits the emitted radiation beam 212, which the optics components 213 split into the primary beam 212*a* and the reference beam 212*b*, and these beams 212*a*, 212*b* superimpose at the detector 217*b* after passing through the conditioning optics 216 and/or the sample 215. In this manner, the primary beam 212*a* and the reference beam 212*b* create an image at the detector 217*b*, which the dimensioning algorithms described herein (e.g., dimensioning algorithm 102*b*2) analyze to determine CDs and/or real-space images of the sample 215.

To achieve the splitting and superposition illustrated in FIG. 2B, the various components of the first example configuration 210 each provide one or more relevant functions. The emitter stage 211*a* generally positions the emitter 211*b* in an optimal place to transmit radiation through the optics components 213 to achieve the optical paths illustrated in FIG. 2B. The emitter 211*b* may be a short wavelength light source configured to emit a single wavelength, multiple wavelengths, or a continuous spectrum of wavelengths. For example, the emitter 211*b* may have flux and coherence requirements, may emit radiation with wavelengths from deep ultraviolet (DUV) of approximately 300 nm to hard X-rays of approximately 0.01 nm. To satisfy these requirements, the emitter 211*b* may utilize any suitable source type, such as X-ray tubes, rotating anodes, free-electron-based, synchrotron, table-top FEL, table-top LINAC based, EUV, DUV, and/or any other suitable source(s) or combinations thereof.

The optics components 213 may generally manipulate the emitted radiation beam 212 in any suitable manner to achieve the optical paths for the primary beam 212*a* and the reference beam 212*b* illustrated in FIG. 2B. For example the optics components 213 may be or include a condenser and a beam splitter. To position the sample 215 to receive the primary beam 212*a*, the multi-axis sample stage 214 may include actuators and/or other mechanical components required to move the sample in any suitable manner to scatter/reflect the primary beam 212*a* as illustrated in FIG. 2B. For example, the multi-axis sample stage 214 may include mechanical components sufficient to move the sample in 5 or more axes (e.g., translation, rotation).

As mentioned, the sample 215 may generally be or include a silicon wafer with a nanopattern or EUV mask/reticle (e.g., including individual structures) to be examined via the holographic imaging metrology techniques described herein. After the primary beam 212*a* scatters/reflects from the sample 215, both the primary beam 212*a* and the reference beam 212*b* reach the conditioning optics 216, which generally combine/converge the wavefront of the primary beam 212*a* and the reference beam 212*b*, to form an image directly on the detector 217*b*. In this embodiment of FIG. 2B, the images formed on the detector 217*b* as result of the conditioning optics 216 may be real-space images of the sample 215. To receive the combined/converged wavefront, the detector stage 217*a* positions the detector 217*b* in the optimal place. The alignment device 218 may generally determine optimal locations for the emitter 211*b*, the sample 215, and/or the detector 217*b*. For example, the alignment device 218 may be, include, and/or otherwise utilize an optical/electron microscope, an ellipsometer, a profiler, an atomic force microscope, and/or any other suitable devices or combinations thereof.

Figure 2C:
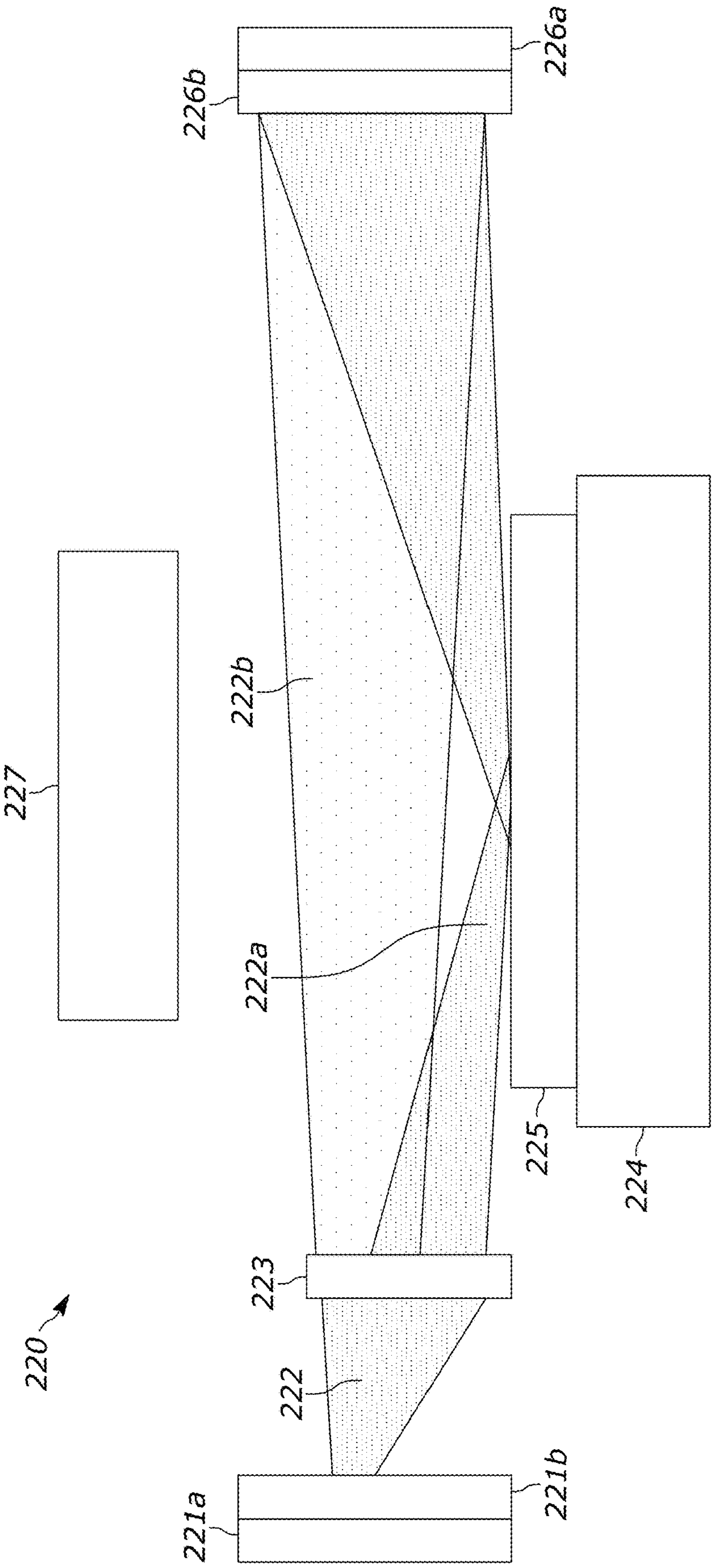

FIG. 2C depicts a second example configuration 220 that is similar to the first example configuration 210 but does not include conditioning optics 216 of the configuration 210. Instead, the second example configuration 220 includes an emitter stage 221*a*, an emitter 221*b*, an emitted radiation beam 222, optics components 223, a primary beam 222*a*, a reference beam 222*b*, a multi-axis sample stage 224, a sample 225, a detector stage 226*a*, a detector 226*b*, and an alignment device 227. Many of the components included as part of the second example configuration 220 may generally perform similar functions as the analogous components included as part of the first example configuration 210. For example, similar to the emitter stage 211*a*, the emitter stage 221*a* is configured to position the emitter 221*b* in an optimal place to transmit radiation through the optics components 223 to achieve the optical paths illustrated in FIG. 2C.

Similar to the first example configuration 210, the emitter 221*b* emits the emitted radiation beam 222, which the optics components 223 split into the primary beam 222*a* and the reference beam 222*b*, and these beams 222*a*, 222*b* superimpose at the detector 226*b*. However, unlike the first example configuration 210, the primary beam 222*a* and the reference beam 222*b* interfere directly at the detector 226*b* to create a hologram because the beams 222*a*, 222*b* are not manipulated by conditioning optics. Accordingly, the detector 226*b* detects/records interference patterns resulting from the superimposition of the primary beam 222*a* and the reference beam 222*b*. The dimensioning algorithms described herein (e.g., dimensioning algorithm 102*b*2) subsequently analyze the hologram resulting from the detected beams 222*a*, 222*b* to determine CDs and/or real-space images of the sample 225.

Figure 2D:
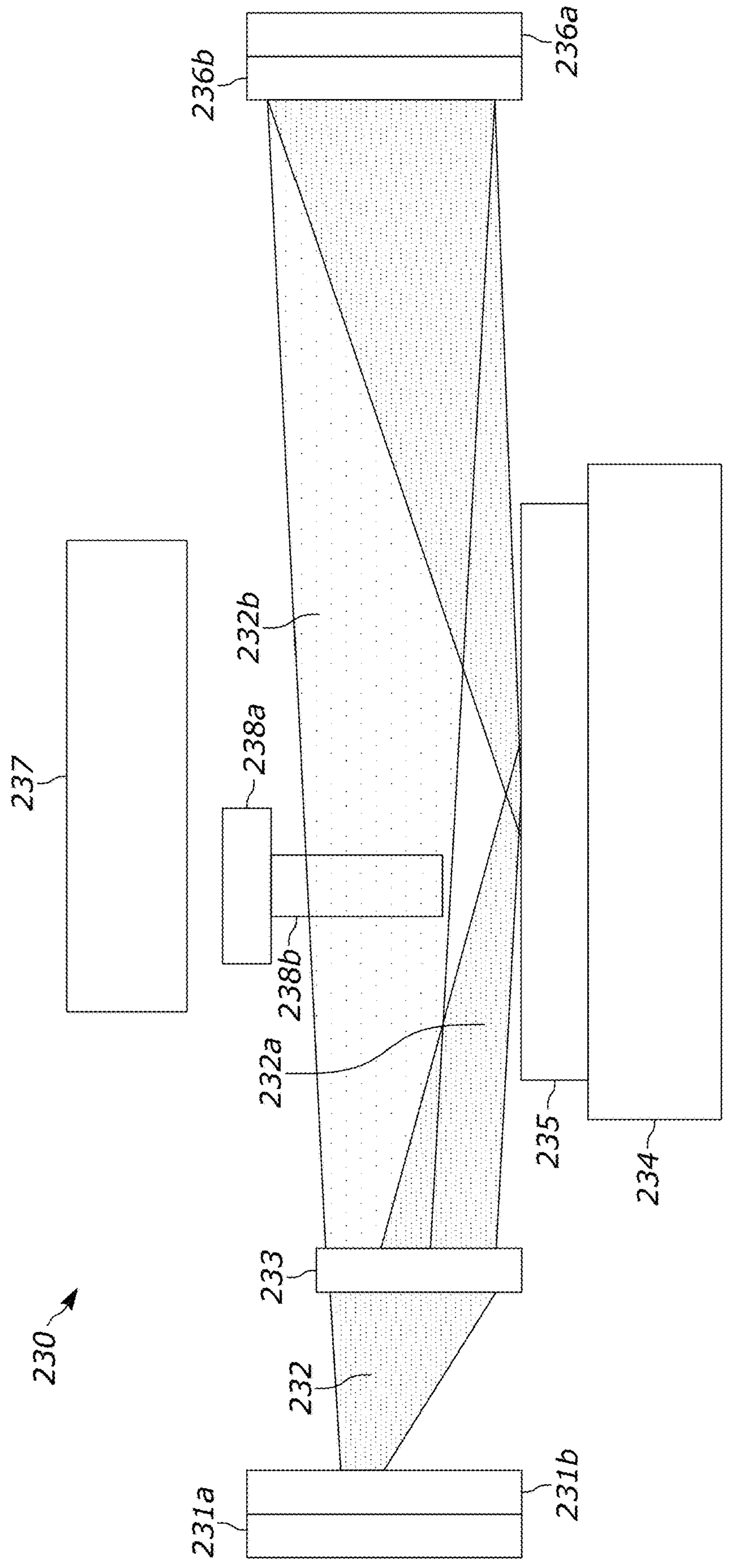

FIG. 2D depicts a third example configuration 230 that is similar to the prior example configurations 210, 220 but includes additional wavefront manipulation components (WFMCs) 238*a*, 238*b*. Namely, the third example configuration 230 includes an emitter stage 231*a*, an emitter 231*b*, an emitted radiation beam 232, optics components 233, a primary beam 232*a*, a reference beam 232*b*, a multi-axis sample stage 234, a sample 235, a detector stage 236*a*, a detector 236*b*, an alignment device 237, a WFMC stage 238*a*, and a WFMC 238*b*. Many of the components included as part of the third example configuration 230 may generally perform similar functions as the analogous components included as part of the prior example configurations 210, 220. For example, similar to the emitter stages 211*a*, 221*a*, the emitter stage 231*a* is configured to position the emitter 231*b* in an optimal place to transmit radiation through the optics components 233 to achieve the optical paths illustrated in FIG. 2D.

Similar to the prior example configurations 210, 220, the emitter 231*b* emits the emitted radiation beam 232, which the optics components 233 split into the primary beam 232*a* and the reference beam 232*b*, and these beams 232*a*, 232*b* superimpose at the detector 236*b*. However, unlike the prior example configurations 210, 220, the reference beam 232*b* is manipulated by the WFMC 238*b* prior to recombining with the primary beam 232*a* at the detector 236*b*.

Generally speaking, the WFMC 238*b* can be or include any static components configured to manipulate the reference beam 232*b*, such as one or more reflective mirrors, refractive lenses, diffractive optics (e.g., Fresnel zone plates and gratings), pinholes (e.g., triangular shape, rectangular shape, pentagonal shape, circular shape, etc.), phase plates, filters, and/or any other suitable components or combinations thereof. In certain embodiments, the WFMC 238*b* may be or include any active components configured to dynamically manipulate the reference beam 232*b* via mechanical (e.g., piezo actuator, MEMS), thermal, and/or chemical methods and/or combinations thereof. It should be appreciated that the WFMC 238*b* and/or others described herein may be positioned in any suitable location (e.g., before/after illuminating the sample 235) to reflect, scatter, focus, and/or otherwise manipulate the reference beam 232*b*, the primary beam 232*a*, and/or other reference/primary beams described herein.

In the embodiment represented by the third example configuration 230, the WFMC 238*b* is positioned in a vertical plane relative to the sample 235 to intercept the reference beam 232*b*. When the reference beam 232*b* transmits through the WFMC 238*b* and the primary beam 232*a* scatters/reflects from the sample 235, the beams 232*a*, 232*b* superimpose at the detector 236*b* to create an interference pattern and/or a real image, depending on the particular WFMC 238*b* in place. The detector 236*b* detects/records interference patterns resulting from the superimposition of the primary beam 232*a* and the reference beam 232*b*. The dimensioning algorithms described herein (e.g., dimensioning algorithm 102*b*2) subsequently analyze the detected beams 232*a*, 232*b* (e.g., scattering patterns, holograms) to determine CDs and/or real-space images of the sample 235.

Figure 2E:
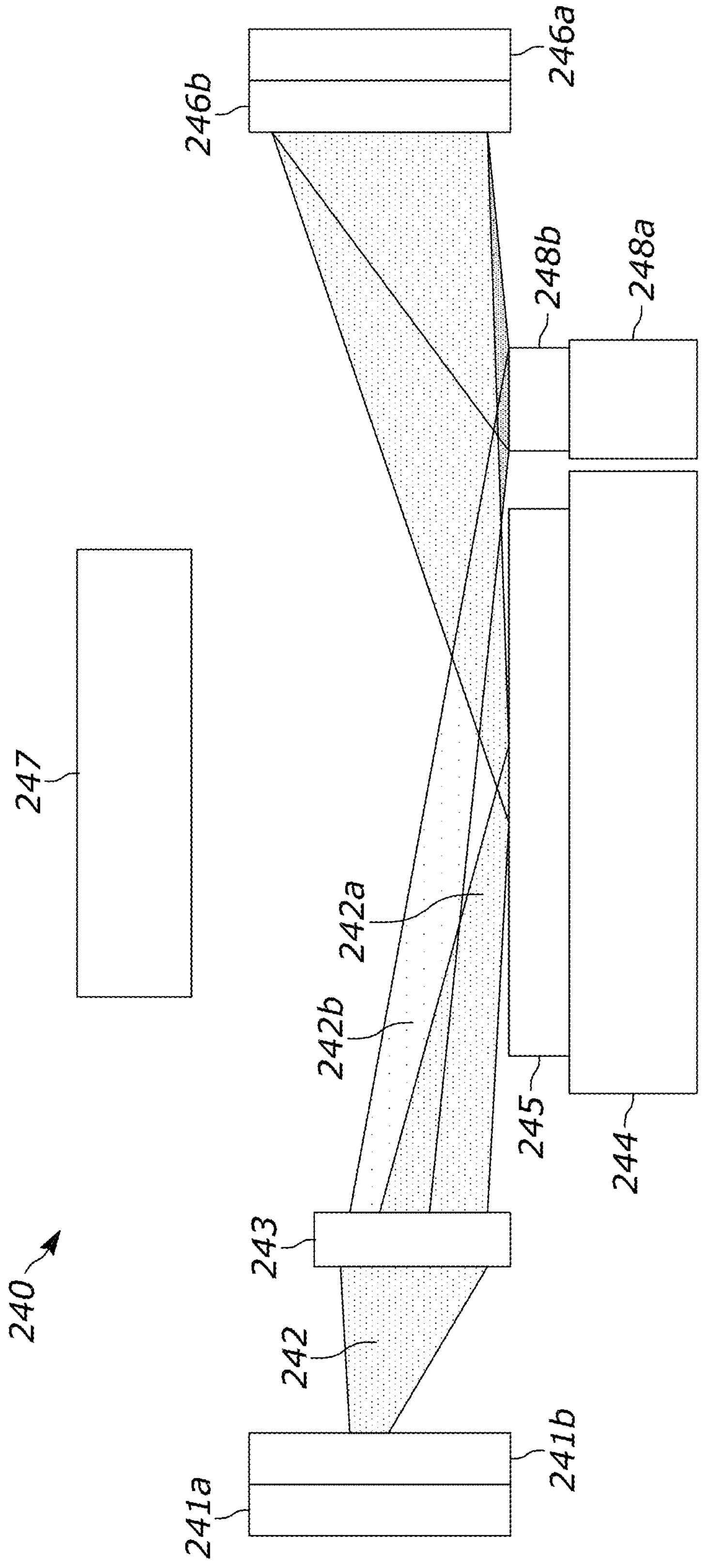

FIG. 2E depicts a fourth example configuration 240 that is similar to the third example configuration 230 but includes WFMCs 248*a*, 248*b* in a sample plane (i.e., co-planar with the sample 245). Namely, the fourth example configuration 240 includes an emitter stage 241*a*, an emitter 241*b*, an emitted radiation beam 242, optics components 243, a primary beam 242*a*, a reference beam 242*b*, a multi-axis sample stage 244, a sample 245, a detector stage 246*a*, a detector 246*b*, an alignment device 247, a WFMC stage 248*a*, and a WFMC 248*b*. Many of the components included as part of the fourth example configuration 240 may generally perform similar functions as the analogous components included as part of the prior example configurations 210-230. For example, similar to the emitter stages 211*a*, 221*a*, 231*a*, the emitter stage 241*a* is configured to position the emitter 241*b* in an optimal place to transmit radiation through the optics components 243 to achieve the optical paths illustrated in FIG. 2E.

Similar to the prior example configurations 210-230, the emitter 241*b* emits the emitted radiation beam 242, which the optics components 243 split into the primary beam 242*a* and the reference beam 242*b*, and these beams 242*a*, 242*b* superimpose at the detector 246*b*. However, unlike the prior example configurations 210-230, the reference beam 242*b* is manipulated by the WFMC 248*b* in the same plane as the primary beam 242*a* prior to recombining with the primary beam 242*a* at the detector 246*b*. The WFMC 248*b* may generally be or include any of the components described with respect to the WFMC 238*b* of FIG. 2D.

In the embodiment represented by the fourth example configuration 240, the WFMC 248*b* is positioned to be co-planar with the sample 245 to scatter/reflect the reference beam 242*b*. When the reference beam 242*b* scatters/reflects from the WFMC 248*b* and the primary beam 242*a* scatters/reflects from the sample 245, the beams 242*a*, 242*b* superimpose at the detector 246*b* to create an interference pattern and/or a real image, depending on the particular WFMC 248*b* in place. The detector 246*b* detects/records interference patterns resulting from the superimposition of the primary beam 242*a* and the reference beam 242*b*. The dimensioning algorithms described herein (e.g., dimensioning algorithm 102*b*2) subsequently analyze the detected beams 242*a*, 242*b* (e.g., scattering patterns, holograms) to determine CDs and/or real-space images of the sample 245.

Figure 2F:
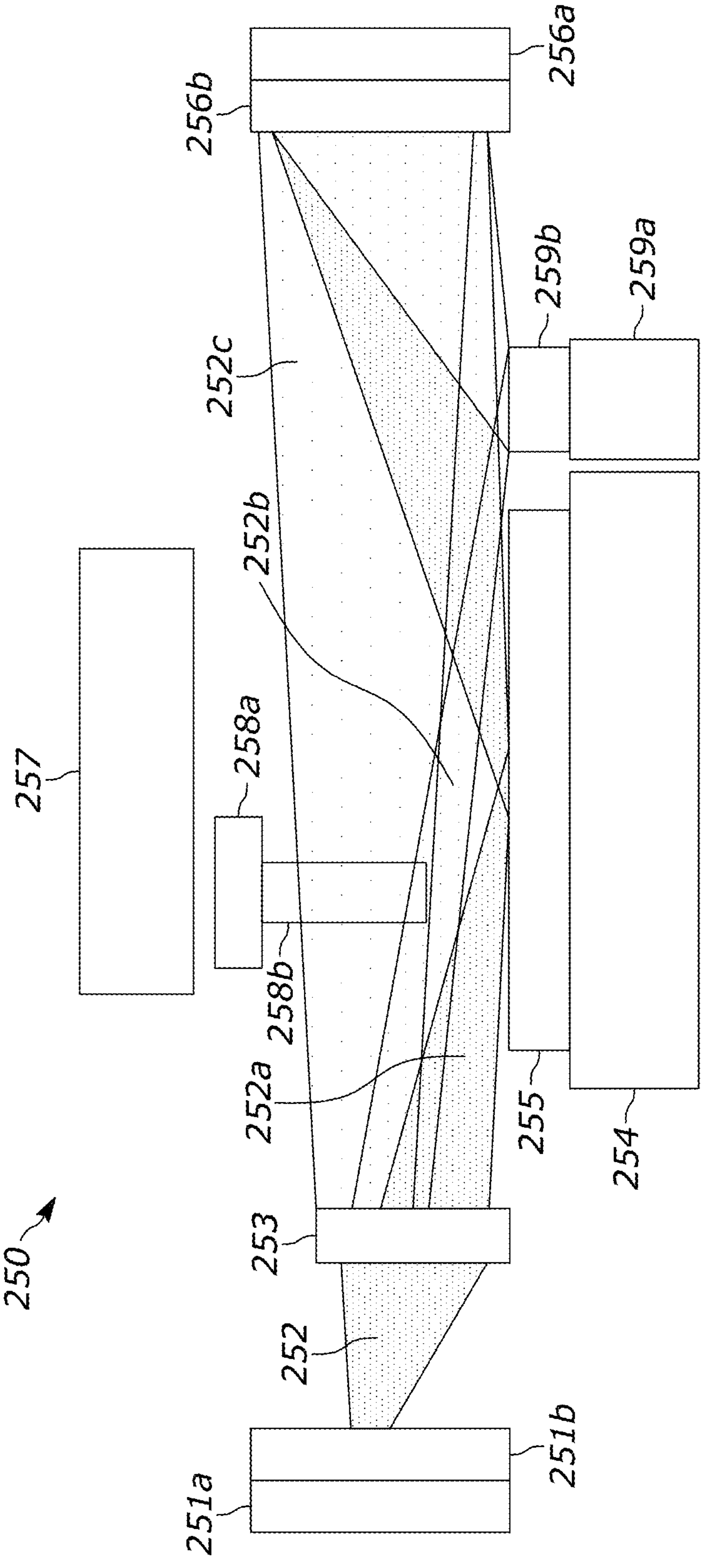

FIG. 2F depicts a fifth example configuration 250 that is similar to the third example configuration 230 and the fourth example configuration 240 but includes two sets of WFMCs 258*a*, 258*b*, 259*a*, 259*b*. A first set of WFMCs 258*a*, 258*b* are positioned in the vertical plane, and a second set of WFMCs 259*a*, 259*b* are positioned in the sample plane (i.e., co-planar with the sample 255). The fifth example configuration 250 includes an emitter stage 251*a*, an emitter 251*b*, an emitted radiation beam 252, optics components 253, a primary beam 252*a*, a reference beam 252*b*, a tertiary beam 252*c*, a multi-axis sample stage 254, a sample 255, a detector stage 256*a*, a detector 256*b*, an alignment device 257, a first WFMC stage 258*a*, a first WFMC 258*b*, a second WFMC stage 259*a*, and a second WFMC 259*b*. Many of the components included as part of the fifth example configuration 250 may generally perform similar functions as the analogous components included as part of the prior example configurations 210-240. For example, similar to the emitter stages 211*a*, 221*a*, 231*a*, 241*a*, the emitter stage 251*a* is configured to position the emitter 251*b* in an optimal place to transmit radiation through the optics components 253 to achieve the optical paths illustrated in FIG. 2F.

Unlike the prior configurations 210-240, the emitter 251*b* emits the emitted radiation beam 252, which the optics components 253 split into the primary beam 252*a*, the reference beam 252*b*, and the tertiary beam 252*b*. These beams 252*a*, 252*b*, 252*c* superimpose at the detector 256*b*. The reference beam 252*b* is manipulated by the WFMC 259*b* in the same plane as the primary beam 252*a* and the tertiary beam 252*c* is manipulated by the WFMC 258*b* in a vertical plane relative to the sample 255. The WFMC 258*b* and/or WFMC 259*b* may generally be or include any of the components described with respect to the WFMC 238*b* of FIG. 2D.

In the embodiment represented by the fifth example configuration 250, when the reference beam 252*b* scatters/reflects from the WFMC 259*b*, the tertiary beam 252*c* scatters/reflects/transmits through the WFMC 258*b*, and the primary beam 252*a* scatters/reflects from the sample 255, the beams 252*a*, 252*b*, 252*c* superimpose at the detector 256*b* to create an interference/scattering pattern (e.g., a 3-wave hologram) and/or a real image, depending on the particular WFMCs 258*b*, 259*b* in place. The detector 256*b* detects/records interference/scattering patterns resulting from the superimposition of the primary beam 252*a*, the reference beam 252*b*, and the tertiary beam 252*c*. The dimensioning algorithms described herein (e.g., dimensioning algorithm 102*b*2) subsequently analyze the detected beams 252*a*, 252*b*, 252*c* (e.g., scattering patterns, holograms) to determine CDs and/or real-space images of the sample 255.

Further, in this fifth example configuration 250, the reference beam 252*b* and the tertiary beam 252*c* are both reference beams that the dimensioning algorithms described herein subsequently analyze to determine CDs and/or real-space images of the sample 255. Thus, it should be appreciated that the systems described herein may emit, scatter and/or otherwise transmit and receive any suitable number of reference beams (e.g., 2, 3, 4, etc.) to determine CDs and/or real-space images of a sample.

It should be understood that the computing systems and/or other systems described herein (e.g., diagnostic/alignment component 206) may actively control any of the optical components and/or wavefront manipulation components described herein (e.g., x-ray optics 203, optics components 213, 223, conditioning optics 216, WFMCs 238*a/b*, 248*a/b*, 258*a/b*, 259*a/b*, etc.) to control/manipulate the radiation wavefront and thereby facilitate the CD parameters reconstruction, as described herein.

Figure 2G:
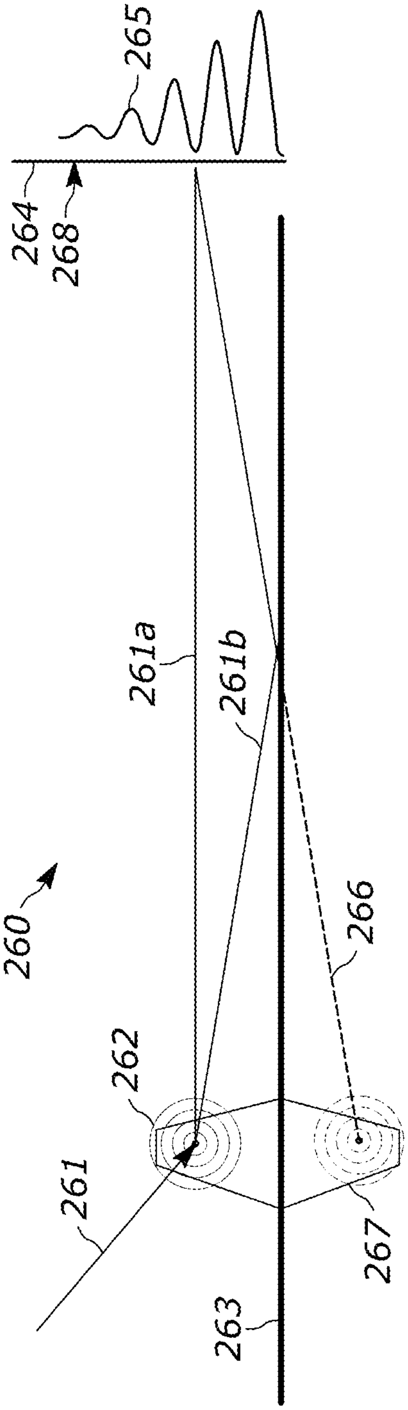
Figure 2H:
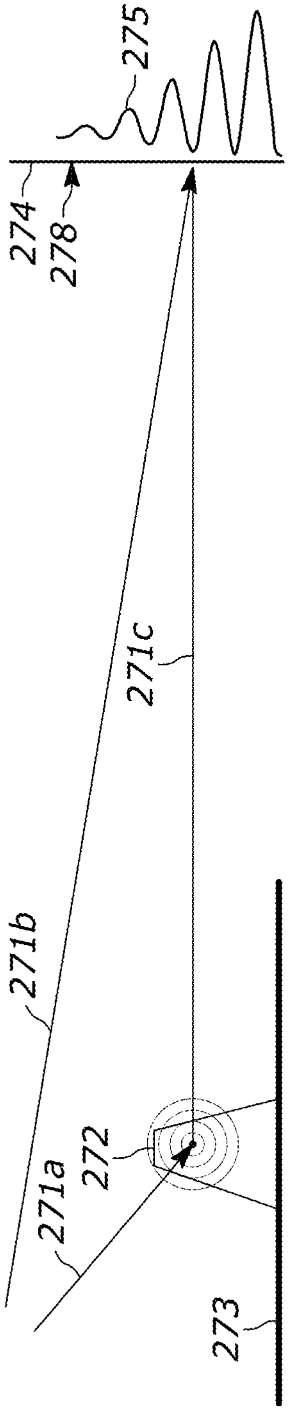

FIGS. 2G and 2H generally depict radiation beam scatterings/reflections and superpositions corresponding with the various example configurations described herein in reference to FIGS. 2A-2F. For example, FIG. 2G depicts an example hologram detection sequence 260 where an incident radiation beam 261 scatters from a sample structure 262 into a primary beam 261*a* and a reference beam 261*b*.

As illustrated in FIG. 2G, the primary beam 261*a* transmits directly to the detector surface 264, where the primary beam 261*a* is detected by a detector (e.g., detectors 207). The reference beam 261*b* reflects from the sample substrate 263 and subsequently transmits to the detector surface 264, where the reference beam 261*b* creates a superposition with the primary beam 261*a* at the detector, as indicated by the interference pattern 265. This interference pattern 265 is representative of the hologram 267 created as a result of the reference beam 261*b* reaching the detector surface 264 after reflecting from the sample substrate 263. As indicated by the false reference beam path 266, the reference beam 261*b* creates a virtual image (i.e., hologram 267) of the sample structure 262 when superpositioned with the primary beam 261*a*.

The interference pattern 265 further indicates a critical angle 268, beyond which, scattered rays from the radiation beam 261 may not reflect from the sample structure 262 and/or the sample substrate 263 in a manner sufficient to reach the detector surface 264. Consequently, the interference pattern 265 does not include additional data beyond the point indicated by the critical angle 268.

FIG. 2H depicts an example detection sequence 270 where a primary beam 271*c* and a reference beam 271*b* combine at a detector surface 274 to create an interference pattern 275.

As illustrated in FIG. 2H, the reference beam 271*b* transmits directly to the detector surface 274, where the reference beam 271*b* is detected by a detector (e.g., detectors 207). An incident beam 271*a* reflects from the sample structure 272, creating the primary beam 271*c*, which subsequently transmits to the detector surface 274. The reference beam 271*b* and primary beam 271*c* combine at the detector surface 274 in a superposition, as indicated by the interference pattern 275. Unlike the example hologram detection sequence 260 of FIG. 2G, neither the reference beam 271*b* nor the primary beam 271*c* reflect from the sample substrate 273. Thus, the interference pattern 275 may be representative of a real image of the sample (e.g., including structure 272 and/or substrate 273).

The interference pattern 275 further indicates a critical angle 278, beyond which, scattered rays from the incident beam 271*a* may not reflect from the sample structure 272 in a manner sufficient to reach the detector surface 274. Consequently, the interference pattern 275 does not include additional data beyond the point indicated by the critical angle 278.

Example Scattering Patterns and Scattering Angles

FIGS. 3A-3K depict multiple scattering patterns detected as a result of various sample configurations, in accordance with various embodiments described herein. Each of the scattering patterns depicted in FIGS. 3A-3K may be generated and/or otherwise analyzed by executing a dimensioning algorithm (e.g., dimensioning algorithm **102*b*2) that, for example, includes one or more physics-based models configured to reproduce the scattering patterns. In certain embodiments, these scattering patterns depicted in FIGS. 3A-3K may represent and/or otherwise indicate holograms representing the sample structure configurations also depicted in FIGS. 3A-3K, such that the application(s)/algorithms described herein can determine one or more CDs and/or real-space images of the sample structure configurations. While the sample structures/gratings illustrated in FIGS. 3A-3K** are primarily rectangular in shape, this is for the purposes of discussion only. It should be appreciated that the sample structures may be of any suitable shape, size, thickness, and/or any other dimension.

Figure 3B:
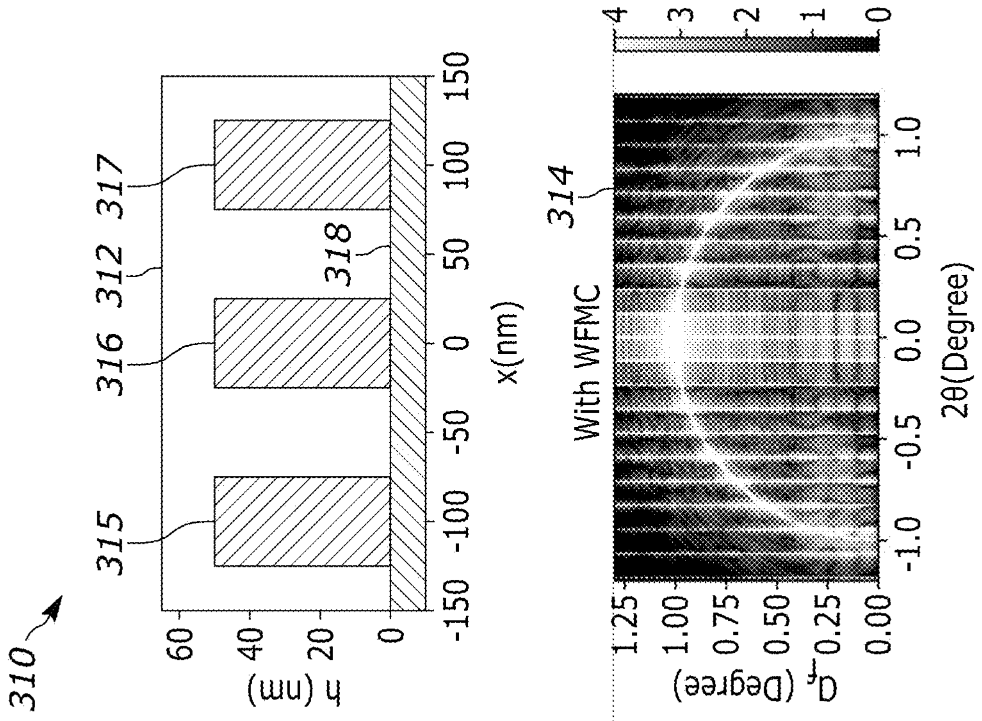
FIGS. 3A-3K depict multiple scattering patterns detected as a result of various sample configurations, in accordance with various embodiments described herein.
Figure 3A:
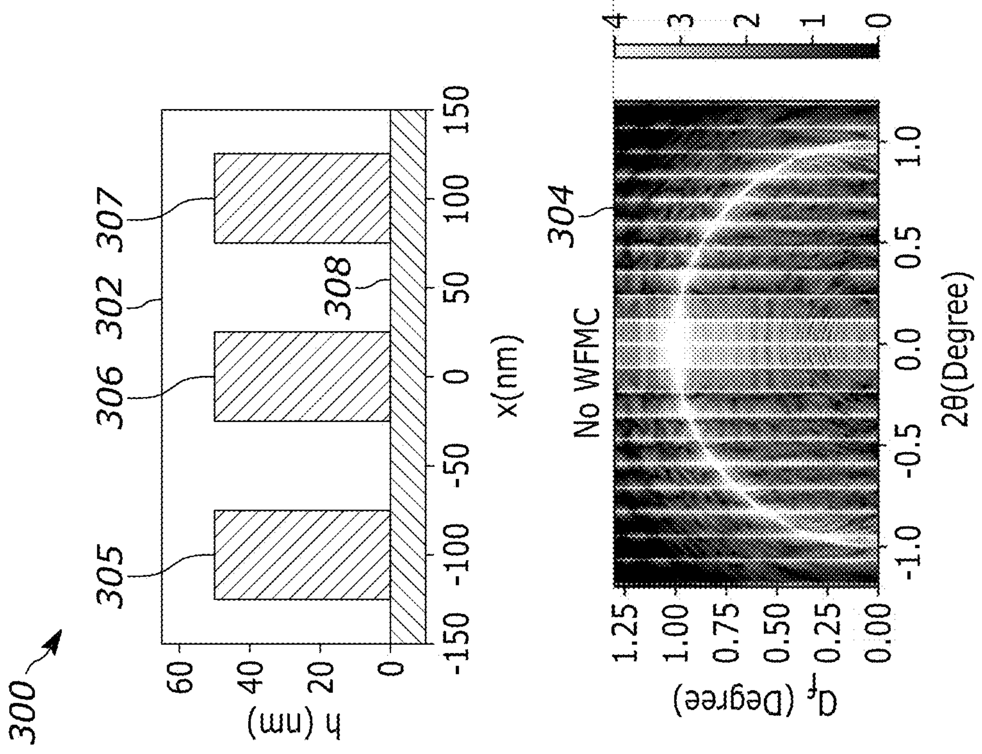

For example, FIGS. 3A and 3B depict scattering pattern differences between component configurations with/without WFMCs. FIG. 3A depicts a first sample structure configuration and corresponding scattering pattern 300, wherein the sample structure configuration (e.g., a cross-sectional front view of the sample structures) is illustrated by the first graph 302, and the resulting scattering pattern is illustrated by the second graph 304.

Namely, the first graph 302 indicates that the sample structures 305, 306, 307 positioned on the sample substrate 308 are each separated by approximately 50 nm and are approximately 50 nm in height. Without any WFMCs positioned within the detection configuration (e.g., example configuration 220), emitted radiation used as part of the CD metrology processes described herein create the scattering pattern depicted in the second graph 304. The scattering pattern of the second graph 304 does not contain very strong interference fringes, but still provides relevant information relating to the CDs of the sample structures 305, 306, 307 represented in the first graph 302.

FIG. 3B depicts a second sample structure configuration and corresponding scattering pattern 310, wherein the sample structure configuration (e.g., a cross-sectional front view of the sample structures) is illustrated by the first graph 312, and the resulting scattering pattern is illustrated by the second graph 314.

Namely, the first graph 312 indicates that the sample structures 315, 316, 317 positioned on the sample substrate 318 are each separated by approximately 50 nm and are approximately 50 nm in height. With one or more WFMCs positioned within the detection configuration (e.g., example configurations 230, 240, 250), emitted radiation used as part of the CD metrology processes described herein create the scattering pattern depicted in the second graph 314. The scattering pattern of the second graph 314 contains very strong interference fringes and provides relevant information relating to the CDs of the sample structures 315, 316, 317 represented in the first graph 312.

Figure 3C:
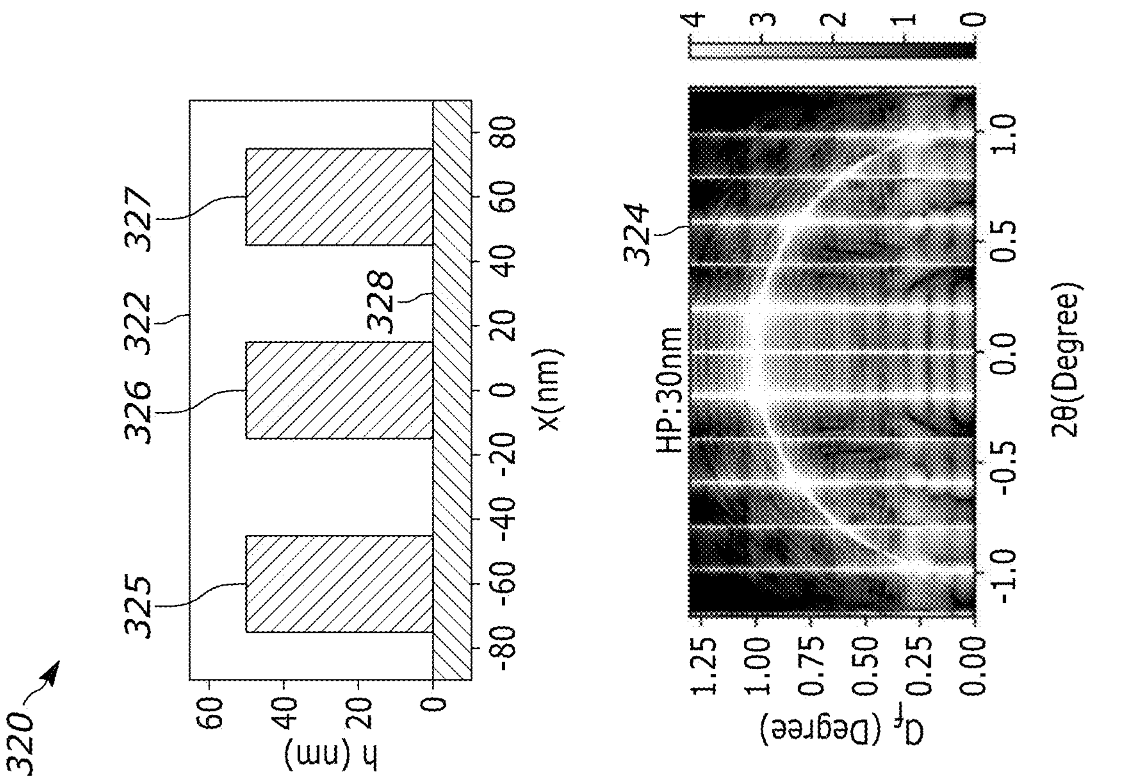
Figure 3D:
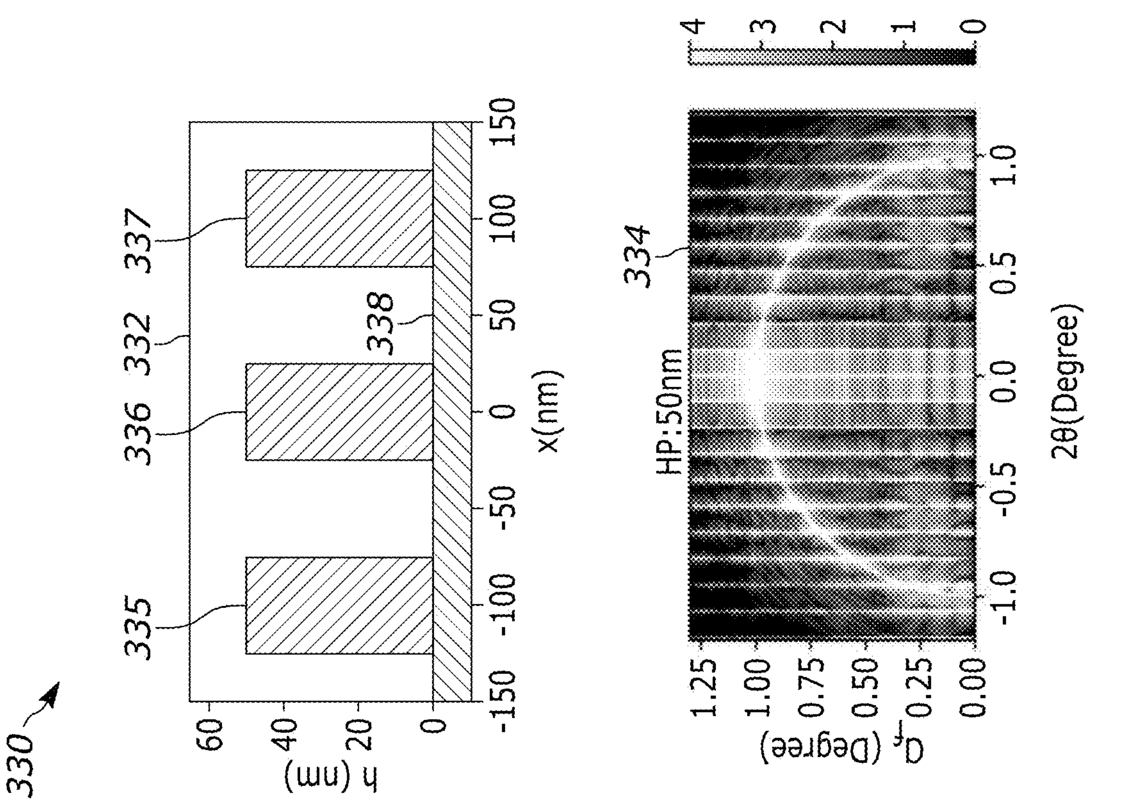
Figure 3F:
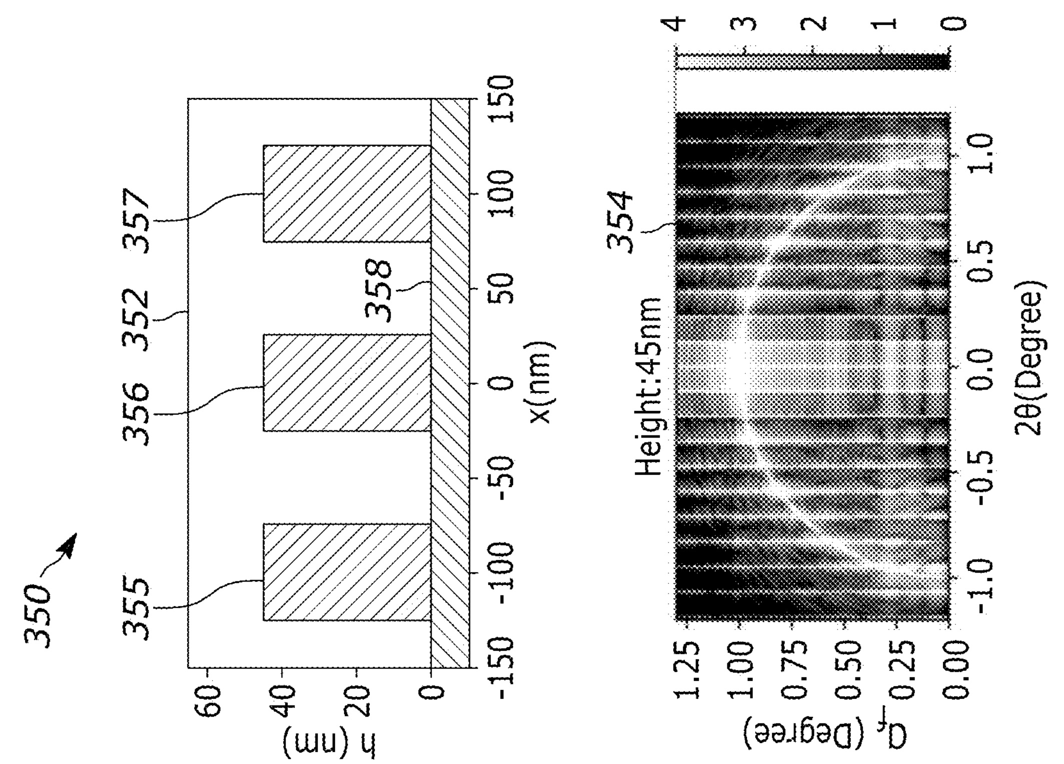
Figure 3E:
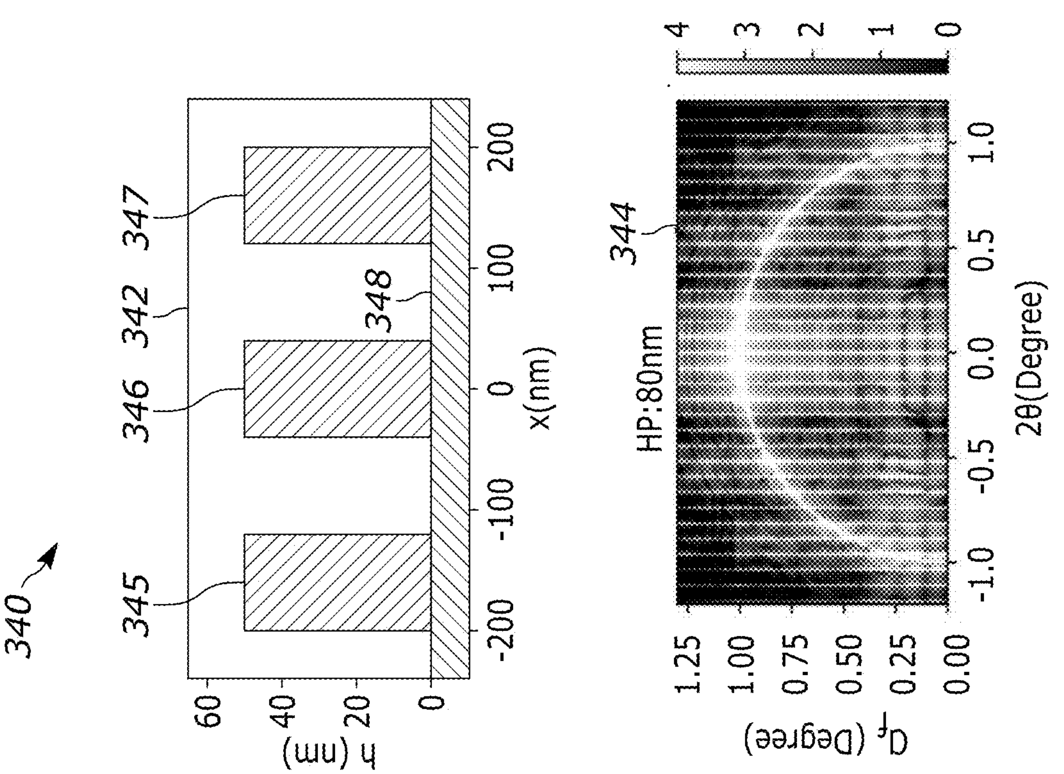

As illustrated by FIGS. 3A and 3B, the scattering patterns (and resulting CDs, images) produced as part of the configurations described herein depend, in part, on the component configuration of the imaging setup. However, the scattering patterns also depend on the configuration of the sample being imaged. For example, FIGS. 3C-3E depict scattering pattern differences resulting from various sample structure spacing configurations. FIG. 3C depicts a third sample structure configuration and corresponding scattering pattern 320, wherein the sample structure configuration (e.g., a cross-sectional front view of the sample structures) is illustrated by the first graph 322, and the resulting scattering pattern is illustrated by the second graph 324.

Namely, the first graph 322 indicates that the sample structures 325, 326, 327 positioned on the sample substrate 328 are each separated by approximately 30 nm and are approximately 50 nm in height. As a consequence of this 30 nm separation between the sample structures 325, 326, 327, emitted radiation used as part of the CD metrology processes described herein create the scattering pattern depicted in the second graph 324. The scattering pattern of the second graph 324 contains relatively sparsely spaced high-intensity vertical lines, which relate to the horizontal spacing (~30 nm) of the sample structures 325, 326, 327 represented in the first graph 322.

FIG. 3D depicts a fourth sample structure configuration and corresponding scattering pattern 330, wherein the sample structure configuration (e.g., a cross-sectional front view of the sample structures) is illustrated by the first graph 332, and the resulting scattering pattern is illustrated by the second graph 334.

Namely, the first graph 332 indicates that the sample structures 335, 336, 337 positioned on the sample substrate 338 are each separated by approximately 50 nm and are approximately 50 nm in height. As a consequence of this 50 nm separation between the sample structures 335, 336, 337, emitted radiation used as part of the CD metrology processes described herein create the scattering pattern depicted in the second graph 334. The scattering pattern of the second graph 324 contains more tightly spaced high-intensity vertical lines than the sample structure configuration illustrated in FIG. 3C as a result of the horizontal spacing (~50 nm) of the sample structures 335, 336, 337 represented in the first graph 332.

FIG. 3E depicts a fifth sample structure configuration and corresponding scattering pattern 340, wherein the sample structure configuration (e.g., a cross-sectional front view of the sample structures) is illustrated by the first graph 342, and the resulting scattering pattern is illustrated by the second graph 344.

Namely, the first graph 342 indicates that the sample structures 345, 346, 347 positioned on the sample substrate 348 are each separated by approximately 80 nm and are approximately 50 nm in height. As a consequence of this 80 nm separation between the sample structures 345, 346, 347, emitted radiation used as part of the CD metrology processes described herein create the scattering pattern depicted in the second graph 344. The scattering pattern of the second graph 344 contains even more tightly spaced high-intensity vertical lines than the sample structure configuration illustrated in FIG. 3D as a result of the horizontal spacing (~80 nm) of the sample structures 345, 346, 347 represented in the first graph 342.

Figure 3H:
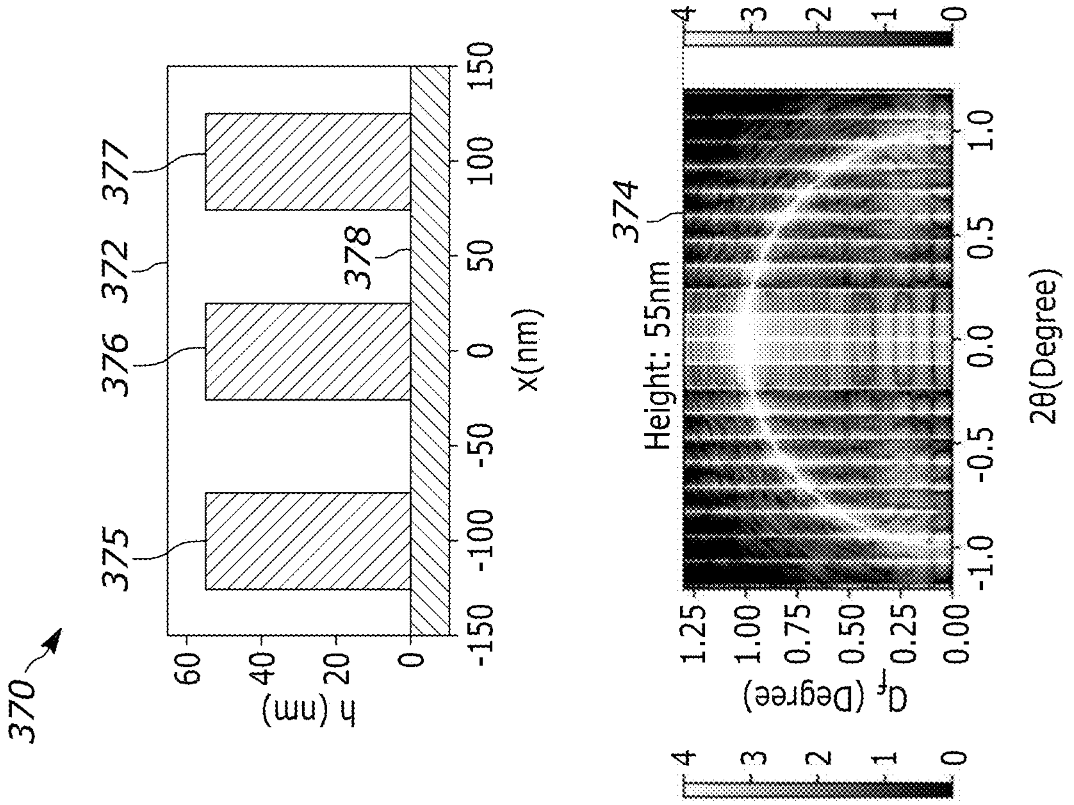
Figure 3G:
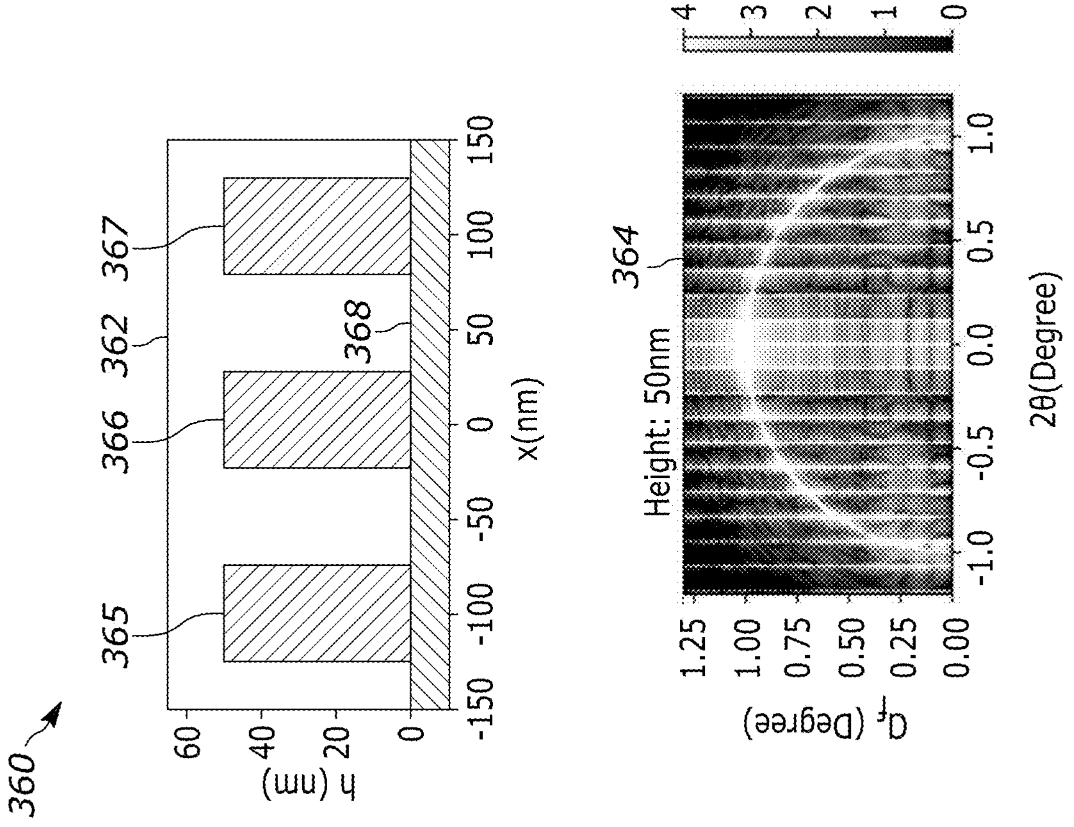

Similar changes to the scattering patterns are achieved through variations in the height of the sample structures. For example, FIGS. 3F-3H depict scattering pattern differences resulting from various sample structure height configurations. FIG. 3F depicts a sixth sample structure configuration and corresponding scattering pattern 350, wherein the sample structure configuration (e.g., a cross-sectional front view of the sample structures) is illustrated by the first graph 352, and the resulting scattering pattern is illustrated by the second graph 354.

Namely, the first graph 352 indicates that the sample structures 355, 356, 357 positioned on the sample substrate 358 are each separated by approximately 50 nm and are approximately 45 nm in height. As a consequence of this 45 nm height of the sample structures 355, 356, 357, emitted radiation used as part of the CD metrology processes described herein create the scattering pattern depicted in the second graph 354. The scattering pattern of the second graph 354 contains horizontal fringes of a first configuration, which relate to the height (~45 nm) of the sample structures 355, 356, 357 represented in the first graph 352.

FIG. 3G depicts a seventh sample structure configuration and corresponding scattering pattern 360, wherein the sample structure configuration (e.g., a cross-sectional front view of the sample structures) is illustrated by the first graph 362, and the resulting scattering pattern is illustrated by the second graph 364.

The first graph 362 indicates that the sample structures 365, 366, 367 positioned on the sample substrate 368 are each separated by approximately 50 nm and are approximately 50 nm in height. As a consequence of this 50 nm height of the sample structures 365, 366, 367, emitted radiation used as part of the CD metrology processes described herein create the scattering pattern depicted in the second graph 364. The scattering pattern of the second graph 364 contains horizontal fringes of a second configuration that is different from the first configuration illustrated in the second graph 354 of FIG. 3F. These horizontal fringes directly relate to the height (~50 nm) of the sample structures 365, 366, 367 represented in the first graph 362.

FIG. 3F depicts an eighth sample structure configuration and corresponding scattering pattern 370, wherein the sample structure configuration (e.g., a cross-sectional front view of the sample structures) is illustrated by the first graph 372, and the resulting scattering pattern is illustrated by the second graph 374.

The first graph 372 indicates that the sample structures 375, 376, 377 positioned on the sample substrate 378 are each separated by approximately 50 nm and are approximately 55 nm in height. As a consequence of this 55 nm height of the sample structures 375, 376, 377, emitted radiation used as part of the CD metrology processes described herein create the scattering pattern depicted in the second graph 374. The scattering pattern of the second graph 374 contains horizontal fringes of a third configuration that is different from the configurations illustrated in the second graphs 354, 364 of FIGS. 3F and 3G, respectively. These horizontal fringes directly relate to the height (~55 nm) of the sample structures 375, 376, 377 represented in the first graph 372.

Figure 3J:
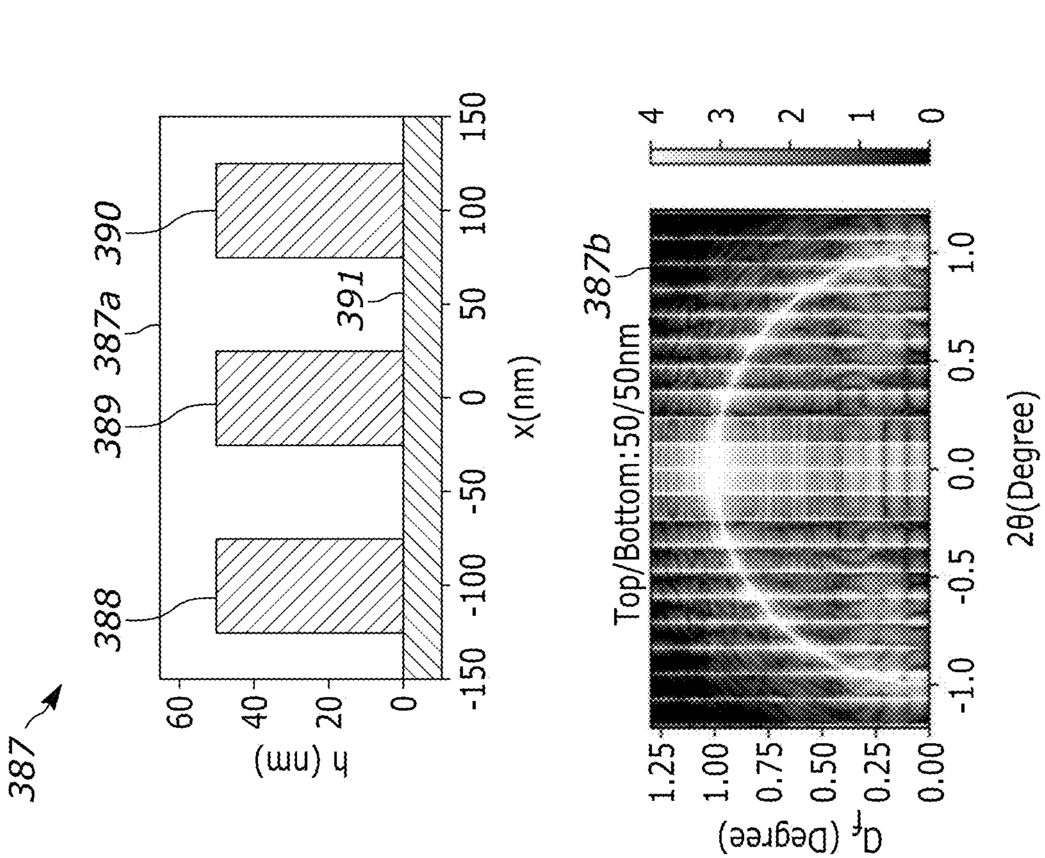
Figure 3I:
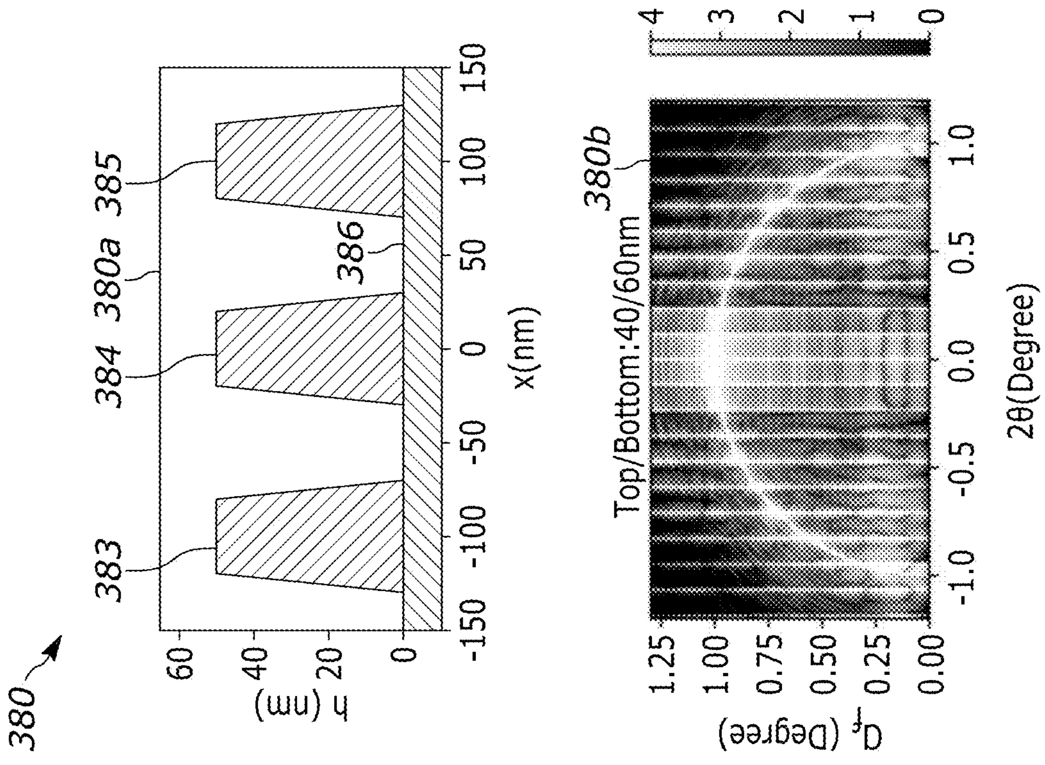
Figure 3K:
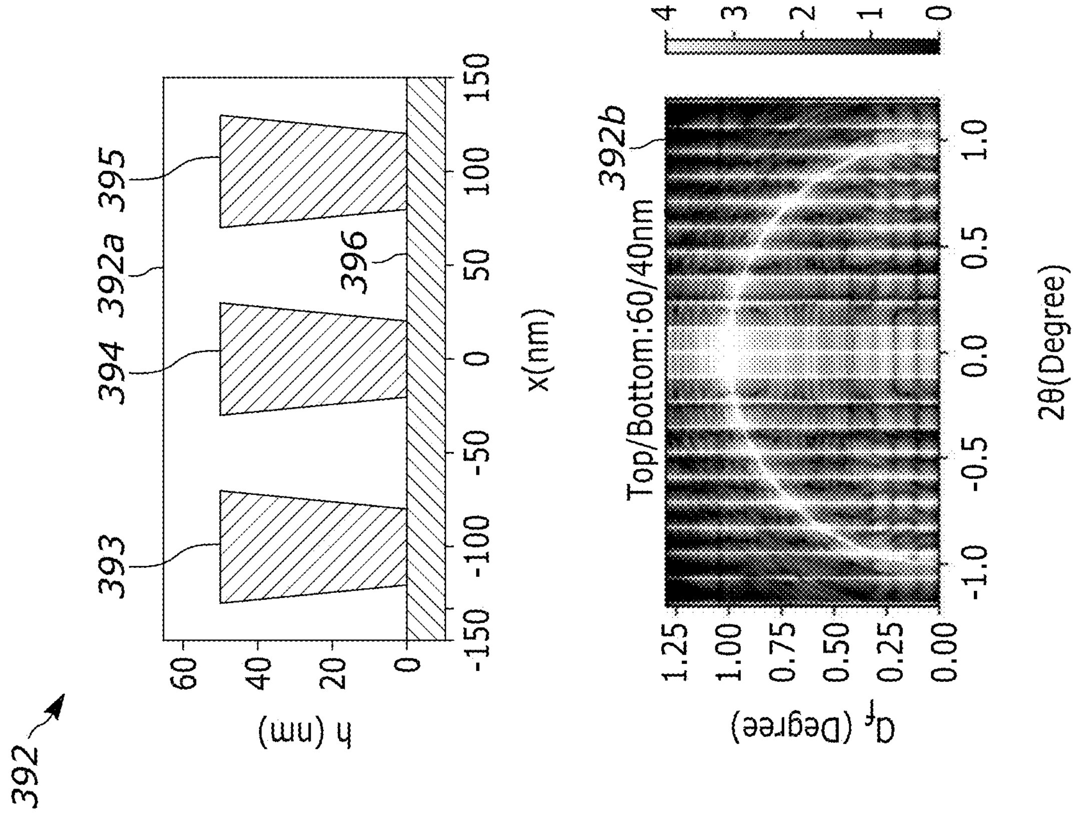

Further changes to the scattering patterns can be achieved through variations in the profile of the sample structures. For example, FIGS. 3I-3K depict scattering pattern differences resulting from various sample structure profile configurations. FIG. 31 depicts a ninth sample structure configuration and corresponding scattering pattern 380, wherein the sample structure configuration (e.g., a cross-sectional front view of the sample structures) is illustrated by the first graph 380*a*, and the resulting scattering pattern is illustrated by the second graph 380*b*.

Namely, the first graph 380*a* indicates that the sample structures 383, 384, 385 positioned on the sample substrate 386 are each separated by approximately 50 nm and have a trapezoidal profile that tapers from a 60 nm width at the base to a 40 nm width at the top. As a consequence of this profile taper of the sample structures 383, 384, 385, emitted radiation used as part of the CD metrology processes described herein create the scattering pattern depicted in the second graph 380*b*. The scattering pattern of the second graph 380*b* contains horizontal fringes and vertical lines of a first configuration, which relate to the tapered profiles of the sample structures 383, 384, 385 represented in the first graph 380*a*.

FIG. 3J depicts a tenth sample structure configuration and corresponding scattering pattern 387, wherein the sample structure configuration (e.g., a cross-sectional front view of the sample structures) is illustrated by the first graph 387*a*, and the resulting scattering pattern is illustrated by the second graph 387*b*.

Namely, the first graph 387*a* indicates that the sample structures 388, 389, 390 positioned on the sample substrate 391 are each separated by approximately 50 nm and have a rectangular profile that maintains a 50 nm width from top to bottom. As a consequence of this rectangular profile of the sample structures 388, 389, 390, emitted radiation used as part of the CD metrology processes described herein create the scattering pattern depicted in the second graph 387*b*. The scattering pattern of the second graph 387*b* contains horizontal fringes and vertical lines of a second configuration that differs from the first configuration illustrated in the second graph 380*b* of FIG. 31. The horizontal fringes and vertical lines relate to the rectangular profiles of the sample structures 388, 389, 390 represented in the first graph 387*a*.

FIG. 3K depicts an eleventh sample structure configuration and corresponding scattering pattern 392, wherein the sample structure configuration (e.g., a cross-sectional front view of the sample structures) is illustrated by the first graph 392*a*, and the resulting scattering pattern is illustrated by the second graph 392*b*.

Namely, the first graph 392*a* indicates that the sample structures 393, 394, 395 positioned on the sample substrate 396 are each separated by approximately 50 nm and have an inverted trapezoidal profile that tapers from a 40 nm width at the base to a 60 nm width at the top. As a consequence of this profile taper of the sample structures 393, 394, 395, emitted radiation used as part of the CD metrology processes described herein create the scattering pattern depicted in the second graph 392*b*. The scattering pattern of the second graph 392*b* contains horizontal fringes and vertical lines of a third configuration that is different from the configurations illustrated in the second graphs 380*b*, 387*b* of FIGS. 3I and 3J, respectively. The horizontal fringes and vertical lines relate to the tapered profiles of the sample structures 393, 394, 395 represented in the first graph 392*a*.

Figure 4:
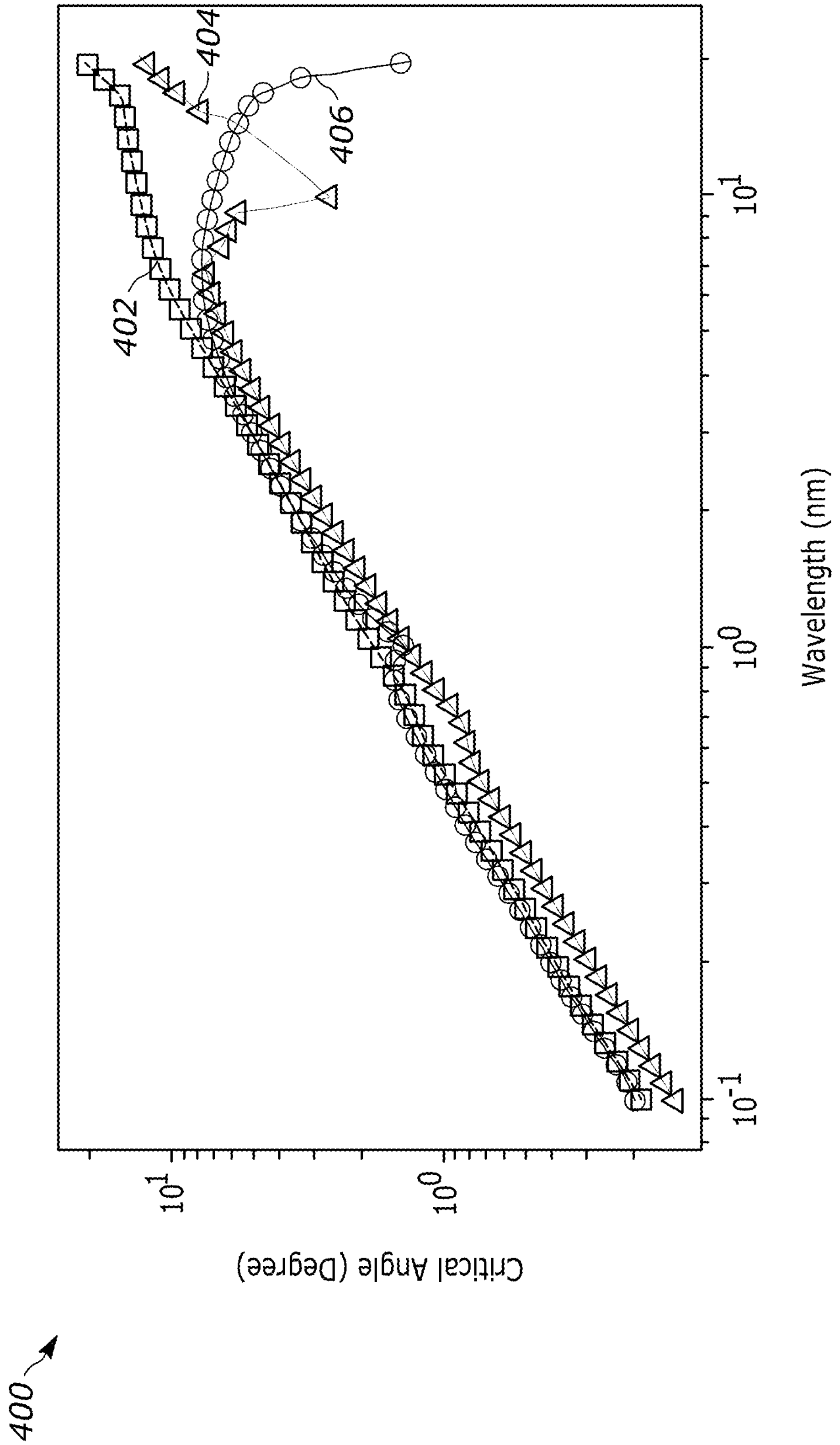
FIG. 4 is a graph depicting an example relationship between incident beam wavelength and critical angle for multiple materials, in accordance with various embodiments described herein.

FIG. 4 is a graph 400 depicting an example relationship between incident beam wavelength and critical angle for multiple materials, in accordance with various embodiments described herein. The graph 400 of FIG. 4 includes three lines associated with three different materials that may be utilized and/or otherwise present during the lithographic masking processes mentioned herein to create patterned wafers. As illustrated by FIG. 4, the critical angle for each material varies significantly based on the radiation wavelength, such that the choice of incident angle used during the metrology processes described herein correspondingly vary in accordance with the chosen radiation wavelength.

For example, the first line 402 represents the relationship between the incident beam wavelength and the critical angle of aluminum oxide (Al2O3). The second line 404 represents the relationship between the incident beam wavelength and the critical angle of silicon (Si). The third line 406 represents the relationship between the incident beam wavelength and the critical angle of germanium (Ge). As previously mentioned, the radiation wavelengths utilized as part of the present techniques may be or include wavelengths generally between DUV (~300 nm) to hard X-rays (~0.01 nm). Thus, the angle of incidence utilized during the metrology processes discussed herein may accordingly vary from significantly less than 1° to greater than 10°.

Example Computer-Implemented Methods

Figure 5A:
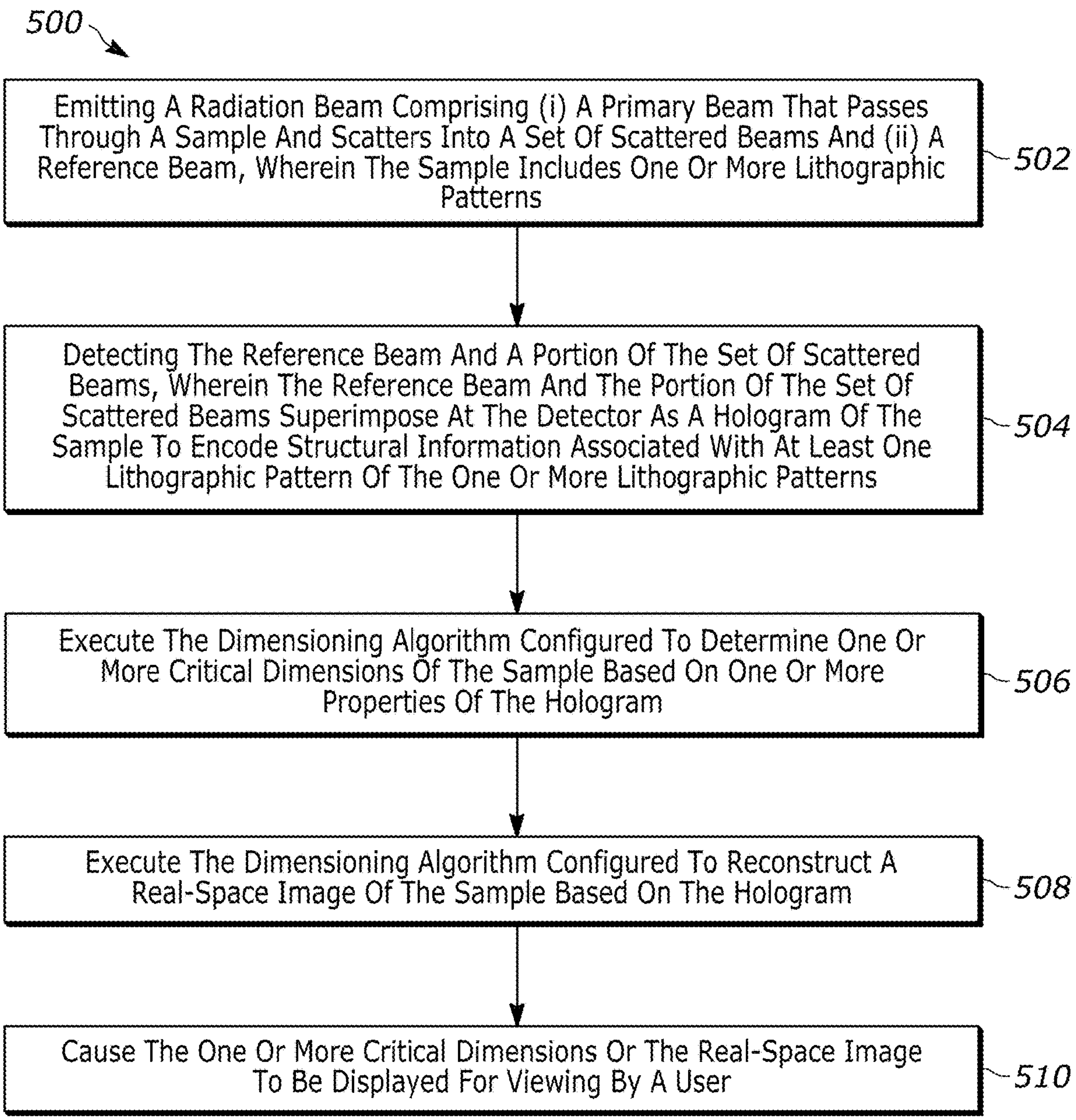
FIG. 5A is a flow diagram representing an example computer-implemented method for improving critical dimension metrology, in accordance with various embodiments described herein.

FIG. 5A depicts a flow diagram representing an example computer-implemented method 500, in accordance with various embodiments described herein. The method 500 may be implemented by one or more processors of the example system 100, such as the processor 102*a* of the critical dimensioning system 102, for example.

The method 500 includes emitting, by an emitter, a radiation beam comprising (i) a primary beam that passes through a sample and scatters into a set of scattered beams and (ii) a reference beam (block 502). The sample generally includes one or more lithographic patterns. The method 500 further includes detecting, by a detector, the reference beam and a portion of the set of scattered beams (block 504). The reference beam and the portion of the set of scattered beams superimpose at the detector as a hologram of the sample to encode structural information associated with at least one lithographic pattern of the one or more lithographic patterns.

The method 500 further includes executing a dimensioning algorithm configured to determine one or more critical dimensions of the sample based on one or more properties of the hologram (block 506). The method 500 further includes executing the dimensioning algorithm to reconstruct a real-space image of the sample based on the hologram (block 508). The method 500 further includes causing the one or more critical dimensions or the real-space image to be displayed for viewing by a user (block 510).

In some embodiments, the one or more properties of the hologram includes at least one scattering pattern of a structure on the sample.

In certain embodiments, the method 500 further includes retrieving, from a structure library, one or more predetermined structure files corresponding to the sample that includes at least one of (i) structure dimensions or (ii) scattering signatures associated with at least one structure corresponding to the one or more lithographic patterns. In these embodiments, the method 500 further includes executing the dimensioning algorithm to determine the one or more critical dimensions of the sample based on (i) the one or more properties of the hologram and (ii) the one or more predetermined structure files.

For example, predetermined structure files may be included as part of a die-to-database methodology implemented by the metrology components/systems described herein. Die-to-Database (D2DB) inspection is a method generally used for defect detection in samples. The metrology components/systems described herein may implement D2DB inspection in accordance with the previously described embodiments, where the computing components described herein compare CDs and/or images generated by the algorithms based on the imaged samples with images generated from the design data used to create the reticle (e.g., the one or more predetermined structure files). The metrology components/systems described herein then identify any discrepancies between the two sets of images to ensure that the features on the reticle (e.g., the sample) match the intended design.

In some embodiments, the dimensioning algorithm includes one or more physics-based models configured to reproduce a scattering pattern resulting from the superposition of the portion of the set of scattered beams with the reference beam.

In certain embodiments, the radiation beam is comprised of coherent X-rays or coherent deep ultraviolet (DUV) rays. Further in these embodiments, the radiation beam has a wavelength within a range of approximately 0.01 nanometers (nm) to 300 nm.

In some embodiments, the method 500 further includes receiving a set of dimension data generated using at least one of: (i) scanning electron microscopy, (ii) transmission electron microscopy, (iii) atomic force microscopy, (iv) optical imaging, or (v) extreme ultraviolet imaging. In these embodiments, the method 500 further includes executing the dimensioning algorithm to determine the one or more critical dimensions of the sample based on (i) the one or more properties of the hologram and (ii) the set of dimension data.

In certain embodiments, the reference beam is (i) reflected from a substrate of the sample, (ii) a scattered beam of the set of scattered beams, or (iii) directed through a wavefront manipulation component. For example, the reference beam may transmit through (and scatter from) a sample before reaching the detector. Further, the reference beam may be directed through any suitable WFMCs, reflected from the sample substrate, and/or created in any other suitable manner or combinations thereof.

In some embodiments, at least one of the one or more critical dimensions of the sample are less than or equal to approximately five nm. Further in these embodiments, at least one of the one or more critical dimensions of the sample are less than or equal to approximately 0.5 nm.

In certain embodiments, the method 500 includes transmitting the one or more critical dimensions to a manufacturing tool or other suitable manufacturing/fabrication device to facilitate the manufacturing/fabrication of a semiconductor device. For example, the metrology components/systems described herein may be integrated components/systems of a larger production toolchain. In these examples, the one or more critical dimensions are used by a manufacturing tool in a digital form to facilitate manufacturing the semiconductor device using the sample.

In some embodiments, the reference beam is two or more reference beams. In these embodiments, each of the reference beams may be created in any suitable manner, as mentioned herein (e.g., reflection from substrate, directed through a WFMC, scattering through sample structure, etc.).

In certain embodiments, the set of scattered beams are scattered by one or more of (i) elastic scattering, (ii) inelastic scattering, or (iii) secondary radiation as a result of a fluorescence process, a phosphorescence process, and/or a plasmonic process. Namely, radiation produced through the fluorescence process can be powerful in semiconductor manufacturing as the wavelength produced through the fluorescence process is generally unique for different materials.

Of course, it is to be appreciated that the actions of the method 500 may be performed any suitable number of times, and that the actions described in reference to the method 500 may be performed in any suitable order.

Figure 5B:
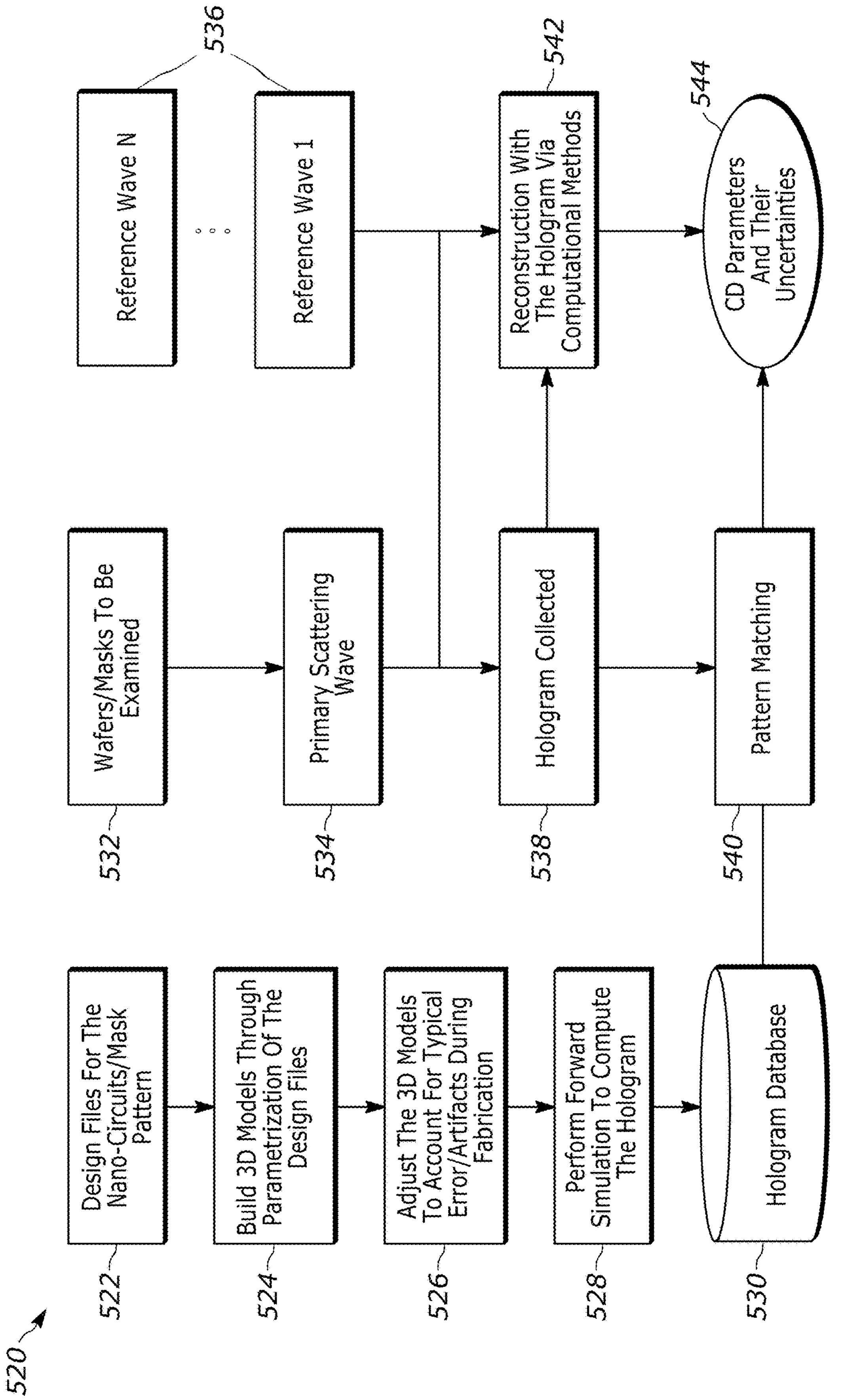
FIG. 5B is a flow diagram representing another example method for improving critical dimension metrology, in accordance with various embodiments described herein.

FIG. 5B depicts another flow diagram representing an example method 520, in accordance with various embodiments described herein. Various functions of the method 520 may be implemented by one or more processors of the example system 100, such as the processor 102*a* and/or the dimensioning components 102*d* of the critical dimensioning system 102, for example.

The method 520 includes generating design files associated with the nano-circuits and/or mask patterns (block 522). This design file generation may be performed by a user accessing a computing device associated with the CD systems described herein and/or may include design contributions from the CD systems described herein. The method 520 further includes building 3D models for sample structures through parameterization of the design files (block 524). The method 520 further includes adjusting the 3D models to account for errors/artifacts that may occur during fabrication (block 526). With the adjusted 3D models, the method 520 further includes performing a forward simulation to calculate holograms corresponding to each of the 3D sample models (block 528). In certain embodiments, this forward simulation may be performed by a dimensioning algorithm (e.g., dimensioning algorithm 102*b*2) and/or other instructions included as part of a dimensioning application (e.g., dimensioning application 102*b*1). The method 520 further includes storing the calculated holograms in a hologram database (block 530).

With these preliminary hologram construction steps performed, the method 520 may further include receiving wafers/masks (i.e., samples) that require CD examination/analysis (block 532). The method 520 further includes transmitting and detecting (1) a primary beam (i.e., a scattering wave) (block 534) and (2) a reference beam (block 536). In certain embodiments, and as illustrated in FIG. 5B, more than one reference beam may be transmitted/detected. For example, two, three, and/or any suitable number of reference waves N (where N is any integer) may be transmitted/detected.

With both the primary beam and the reference beam detected, the method 520 includes collecting/calculating the hologram of the samples (block 538) and reconstructing the real-space image of the samples based on the hologram using the computational methods described herein (e.g., dimensioning algorithm 102*b*2). The method 520 further includes matching a hologram pattern from the hologram database with the collected/calculated holograms (block 540). The method 520 further includes determining the CDs and any corresponding uncertainties based on the hologram pattern retrieved from the hologram database and the reconstructed real-space image of the sample (block 544).

Of course, it is to be appreciated that the actions of the method 520 may be performed any suitable number of times, and that the actions described in reference to the method 520 may be performed in any suitable order.

Aspects

The following list of aspects reflects a variety of the embodiments explicitly contemplated by the present disclosure. Those of ordinary skill in the art will readily appreciate that the aspects below are neither limiting of the embodiments disclosed herein, nor exhaustive of all of the embodiments conceivable from the disclosure above, but are instead meant to be exemplary in nature.

Aspect 1. A computer-implemented method for improved critical dimension metrology, comprising: emitting, by an emitter, a radiation beam comprising (i) a primary beam that passes through a sample and scatters into a set of scattered beams and (ii) a reference beam, wherein the sample includes one or more lithographic patterns; detecting, by a detector, the reference beam and a portion of the set of scattered beams, wherein the reference beam and the portion of the set of scattered beams superimpose at the detector as a hologram of the sample to encode structural information associated with at least one lithographic pattern of the one or more lithographic patterns; executing, by one or more processors, a dimensioning algorithm configured to: determine one or more critical dimensions of the sample based on one or more properties of the hologram, and reconstruct a real-space image of the sample based on the hologram; and causing, by the one or more processors, the one or more critical dimensions or the real-space image to be displayed for viewing by a user.

Aspect 2. The computer-implemented method of aspect 1, wherein the one or more properties of the hologram includes at least one scattering pattern of a structure on the sample.

Aspect 3. The computer-implemented method of aspect 1, further comprising: retrieving, from a structure library, one or more predetermined structure files corresponding to the sample that includes at least one of (i) structure dimensions or (ii) scattering signatures associated with at least one structure corresponding to the one or more lithographic patterns; and executing, by the one or more processors, the dimensioning algorithm to determine the one or more critical dimensions of the sample based on (i) the one or more properties of the hologram and (ii) the one or more predetermined structure files.

Aspect 4. The computer-implemented method of aspect 1, wherein the dimensioning algorithm includes one or more physics-based models configured to reproduce a scattering pattern resulting from a superposition of the portion of the set of scattered beams with the reference beam.

Aspect 5. The computer-implemented method of aspect 1, wherein the radiation beam is comprised of coherent X-rays or coherent deep ultraviolet (DUV) rays.

Aspect 6. The computer-implemented method of aspect 5, wherein the radiation beam has a wavelength within a range of approximately 0.01 nanometers (nm) to 300 nm.

Aspect 7. The computer-implemented method of aspect 1, further comprising: receiving, at the one or more processors, a set of dimension data generated using at least one of: (i) scanning electron microscopy, (ii) transmission electron microscopy, (iii) atomic force microscopy, (iv) optical imaging, or (v) extreme ultraviolet imaging; and executing, by the one or more processors, the dimensioning algorithm to determine the one or more critical dimensions of the sample based on (i) the one or more properties of the hologram and (ii) the set of dimension data.

Aspect 8. The computer-implemented method of aspect 1, wherein the reference beam is (i) reflected from a substrate of the sample, (ii) a scattered beam of the set of scattered beams, or (iii) directed through a wavefront manipulation component.

Aspect 9. The computer-implemented method of aspect 1, wherein at least one of the one or more critical dimensions of the sample are less than or equal to approximately five nanometers (nm), and wherein at least one of the one or more critical dimensions of the sample are less than or equal to approximately 0.5 nm.

Aspect 10. The computer-implemented method of aspect 1, further comprising: transmitting, by the one or more processors, the one or more critical dimensions to a manufacturing tool to facilitate manufacturing of a semiconductor device.

Aspect 11. The computer-implemented method of aspect 1, wherein the reference beam is two or more reference beams.

Aspect 12. The computer-implemented method of aspect 1, wherein the set of scattered beams are scattered by one or more of (i) elastic scattering, (ii) inelastic scattering, or (iii) secondary radiation as a result of a fluorescence process, a phosphorescence process, or a plasmonic process.

Aspect 13. A system for improved critical dimension metrology, comprising: an emitter configured to emit radiation; a detector configured to detect the radiation; one or more processors; and one or more memories communicatively coupled with the one or more processors, the emitter, and the detector, wherein the one or more memories store computer-executable instructions thereon that, when executed by the one or more processors, cause the system to: emit, by the emitter, a radiation beam comprising (i) a primary beam that passes through a sample and scatters into a set of scattered beams and (ii) a reference beam, wherein the sample includes one or more lithographic patterns; detect, by the detector, the reference beam and a portion of the set of scattered beams, wherein the reference beam and the portion of the set of scattered beams superimpose at the detector as a hologram of the sample to encode structural information associated with at least one lithographic pattern of the one or more lithographic patterns; execute a dimensioning algorithm configured to: determine one or more critical dimensions of the sample based on one or more properties of the hologram, and reconstruct a real-space image of the sample based on the hologram; and cause the one or more critical dimensions or the real-space image to be displayed for viewing by a user.

Aspect 14. The system of aspect 13, wherein the one or more properties of the hologram includes at least one scattering pattern of a structure on the sample.

Aspect 15. The system of aspect 13, wherein the computer-executable instructions, when executed by the one or more processors, further cause the system to: retrieve, from a structure library, one or more predetermined structure files corresponding to the sample that includes at least one of (i) structure dimensions or (ii) scattering signatures associated with at least one structure corresponding to the one or more lithographic patterns; and execute the dimensioning algorithm to determine the one or more critical dimensions of the sample based on (i) the one or more properties of the hologram and (ii) the one or more predetermined structure files.

Aspect 16. The system of aspect 13, wherein the dimensioning algorithm includes one or more physics-based models configured to reproduce a scattering pattern resulting from a superposition of the portion of the set of scattered beams with the reference beam.

Aspect 17. The system of aspect 13, wherein the radiation beam is comprised of coherent radiation having a wavelength within a range of approximately 0.01 nanometers (nm) to 300 nm.

Aspect 18. The system of aspect 13, wherein the computer-executable instructions, when executed by the one or more processors, further cause the system to: receive a set of dimension data generated using at least one of: (i) scanning electron microscopy, (ii) transmission electron microscopy, (iii) atomic force microscopy, (iv) optical imaging, or (v) extreme ultraviolet imaging; and execute the dimensioning algorithm to determine the one or more critical dimensions of the sample based on (i) the one or more properties of the hologram and (ii) the set of dimension data.

Aspect 19. The system of aspect 13, wherein at least one of the one or more critical dimensions of the sample are less than or equal to approximately five nanometers (nm), and at least one of the one or more critical dimensions of the sample are less than or equal to approximately 0.5 nm.

Aspect 20. A non-transitory computer-readable storage medium including instructions for improved critical dimension metrology that, when executed by one or more processors, cause the one or more processors to: receive a signal generated from a reference beam and a portion of a set of scattered beams that passed through a sample, wherein the reference beam and the portion of the set of scattered beams are superimposed as a hologram of the sample to encode structural information associated with at least one lithographic pattern of one or more lithographic included on the sample; execute a dimensioning algorithm configured to: determine one or more critical dimensions of the sample based on one or more properties of the hologram, and reconstruct a real-space image of the sample based on the hologram; and cause the one or more critical dimensions or the real-space image to be displayed for viewing by a user.

Additional Considerations

The following additional considerations apply to the foregoing discussion. Throughout this specification, plural instances may implement functions, components, operations, or structures described as a single instance. Although individual functions and instructions of one or more methods are illustrated and described as separate operations, one or more of the individual operations may be performed concurrently, and nothing requires that the operations be performed in the order illustrated. Structures and functionality presented as separate components in exemplary configurations may be implemented as a combined structure or component. Similarly, structures and functionality presented as a single component may be implemented as separate components. These and other variations, modifications, additions, and improvements fall within the scope of the subject matter herein.

Additionally, certain embodiments are described herein as including logic or a number of functions, components, modules, blocks, or mechanisms. Functions may constitute either software modules (e.g., non-transitory code stored on a tangible machine-readable storage medium) or hardware modules. A hardware module is a tangible unit capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

Accordingly, the term hardware should be understood to encompass a tangible entity, which may be one of an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware and software modules may provide information to, and receive information from, other hardware and/or software modules. Accordingly, the described hardware modules may be regarded as being communicatively coupled. Where multiple of such hardware or software modules exist contemporaneously, communications may be achieved through signal transmission (e.g., over appropriate circuits and buses) that connect the hardware or software modules. In embodiments in which multiple hardware modules or software are configured or instantiated at different times, communications between such hardware or software modules may be achieved, for example, through the storage and retrieval of information in memory structures to which the multiple hardware or software modules have access. For example, one hardware or software module may perform an operation and store the output of that operation in a memory device to which it is communicatively coupled. A further hardware or software module may then, at a later time, access the memory device to retrieve and process the stored output. Hardware and software modules may also initiate communications with input or output devices, and may operate on a resource (e.g., a collection of information).

The various operations of exemplary functions and methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some exemplary embodiments, comprise processor-implemented modules.

Similarly, the methods or functions described herein may be at least partially processor-implemented. For example, at least some of the functions of a method may be performed by one or more processors or processor-implemented hardware modules. The performance of certain of the functions may be distributed among the one or more processors, not only residing within a single machine, but deployed across a number of machines. In some exemplary embodiments, the processor or processors may be located in a single location (e.g., within a home environment, an office environment or as a server farm), while in other embodiments the processors may be distributed across a number of locations.

The one or more processors may also operate to support performance of the relevant operations in a "cloud computing" environment or as a "software as a service" (SaaS). For example, at least some of the functions may be performed by a group of computers (as examples of machines including processors). These operations are accessible via a network (e.g., the Internet) and via one or more appropriate interfaces (e.g., application program interfaces (APIs)).

The performance of certain operations may be distributed among the one or more processors, not only residing within a single machine, but deployed across a number of machines. In some exemplary embodiments, the one or more processors or processor-implemented modules may be located in a single geographic location (e.g., within a home environment, an office environment, or a server farm). In other exemplary embodiments, the one or more processors or processor-implemented modules may be distributed across a number of geographic locations.

Some portions of this specification are presented in terms of algorithms or symbolic representations of operations on data and data structures stored as bits or binary digital signals within a machine memory (e.g., a computer memory). These algorithms or symbolic representations are examples of techniques used by those of ordinary skill in the data processing arts to convey the substance of their work to others skilled in the art. As used herein, a "function" or an "algorithm" or a "routine" is a self-consistent sequence of operations or similar processing leading to a desired result. In this context, functions, algorithms, routines and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "some embodiments" or "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a function, process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B Is true (or present), and both A and B are true (or present).

In addition, use of the "a" or "an" are employed to describe elements and components of the embodiments herein. This is done merely for convenience and to give a general sense of the description. This description should be read to include one or at least one and the singular also includes the plural unless it is obvious that it is meant otherwise.

Still further, the figures depict preferred embodiments of various systems for purposes of illustration only. One of ordinary skill in the art will readily recognize from the following discussion that alternative embodiments of the structures and methods illustrated herein may be employed without departing from the principles described herein.

Upon reading this disclosure, those of skill in the art will appreciate still additional alternative structural and functional designs through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the techniques disclosed herein without departing from the spirit and scope defined in the appended claims.

What is claimed is:

1. A computer-implemented method for improved critical dimension metrology, comprising:

emitting, by an emitter, a radiation beam comprising (i) a primary beam that passes through a sample and scatters into a set of scattered beams and (ii) a reference beam, wherein the sample includes one or more lithographic patterns;

detecting, by a detector, the reference beam and a portion of the set of scattered beams, wherein the reference beam and the portion of the set of scattered beams superimpose at the detector as a hologram of the sample to encode structural information associated with at least one lithographic pattern of the one or more lithographic patterns;

executing, by one or more processors, a dimensioning algorithm configured to:

determine one or more critical dimensions of the sample based on one or more properties of the hologram, and reconstruct a real-space image of the sample based on the hologram; and causing, by the one or more processors, the one or more critical dimensions or the real-space image to be displayed for viewing by a user.

2. The computer-implemented method of claim 1, wherein the one or more properties of the hologram includes at least one scattering pattern of a structure on the sample.

3. The computer-implemented method of claim 1, further comprising:

retrieving, from a structure library, one or more predetermined structure files corresponding to the sample that includes at least one of (i) structure dimensions or (ii) scattering signatures associated with at least one structure corresponding to the one or more lithographic patterns; and executing, by the one or more processors, the dimensioning algorithm to determine the one or more critical dimensions of the sample based on (i) the one or more properties of the hologram and (ii) the one or more predetermined structure files.

4. The computer-implemented method of claim 1, wherein the dimensioning algorithm includes one or more physics-based models configured to reproduce a scattering pattern resulting from a superposition of the portion of the set of scattered beams with the reference beam.

5. The computer-implemented method of claim 1, wherein the radiation beam is comprised of coherent X-rays or coherent deep ultraviolet (DUV) rays.

6. The computer-implemented method of claim 5, wherein the radiation beam has a wavelength within a range of approximately 0.01 nanometers (nm) to 300 nm.

7. The computer-implemented method of claim 1, further comprising:

receiving, at the one or more processors, a set of dimension data generated using at least one of: (i) scanning electron microscopy, (ii) transmission electron microscopy, (iii) atomic force microscopy, (iv) optical imaging, or (v) extreme ultraviolet imaging; and executing, by the one or more processors, the dimensioning algorithm to determine the one or more critical dimensions of the sample based on (i) the one or more properties of the hologram and (ii) the set of dimension data.

8. The computer-implemented method of claim 1, wherein the reference beam is (i) reflected from a substrate of the sample, (ii) a scattered beam of the set of scattered beams, or (iii) directed through a wavefront manipulation component.

9. The computer-implemented method of claim 1, wherein at least one of the one or more critical dimensions of the sample are less than or equal to approximately five nanometers (nm), and wherein at least one of the one or more critical dimensions of the sample are less than or equal to approximately 0.5 nm.

10. The computer-implemented method of claim 1, further comprising:

transmitting, by the one or more processors, the one or more critical dimensions to a manufacturing tool to facilitate manufacturing of a semiconductor device.

11. The computer-implemented method of claim 1, wherein the reference beam is two or more reference beams.

12. The computer-implemented method of claim 1, wherein the set of scattered beams are scattered by one or more of (i) elastic scattering, (ii) inelastic scattering, or (iii) secondary radiation as a result of a fluorescence process, a phosphorescence process, or a plasmonic process.

13. A system for improved critical dimension metrology, comprising:

an emitter configured to emit radiation;

a detector configured to detect the radiation;

one or more processors; and one or more memories communicatively coupled with the one or more processors, the emitter, and the detector, wherein the one or more memories store computer-executable instructions thereon that, when executed by the one or more processors, cause the system to:

emit, by the emitter, a radiation beam comprising (i) a primary beam that passes through a sample and scatters into a set of scattered beams and (ii) a reference beam, wherein the sample includes one or more lithographic patterns;

detect, by the detector, the reference beam and a portion of the set of scattered beams, wherein the reference beam and the portion of the set of scattered beams superimpose at the detector as a hologram of the sample to encode structural information associated with at least one lithographic pattern of the one or more lithographic patterns;

execute a dimensioning algorithm configured to:

determine one or more critical dimensions of the sample based on one or more properties of the hologram, and reconstruct a real-space image of the sample based on the hologram; and cause the one or more critical dimensions or the real-space image to be displayed for viewing by a user.

14. The system of claim 13, wherein the one or more properties of the hologram includes at least one scattering pattern of a structure on the sample.

15. The system of claim 13, wherein the computer-executable instructions, when executed by the one or more processors, further cause the system to:

retrieve, from a structure library, one or more predetermined structure files corresponding to the sample that includes at least one of (i) structure dimensions or (ii) scattering signatures associated with at least one structure corresponding to the one or more lithographic patterns; and execute the dimensioning algorithm to determine the one or more critical dimensions of the sample based on (i)

the one or more properties of the hologram and (ii) the one or more predetermined structure files.

16. The system of claim 13, wherein the dimensioning algorithm includes one or more physics-based models configured to reproduce a scattering pattern resulting from a superposition of the portion of the set of scattered beams with the reference beam.

17. The system of claim 13, wherein the radiation beam is comprised of coherent radiation having a wavelength within a range of approximately 0.01 nanometers (nm) to 300 nm.

18. The system of claim 13, wherein the computer-executable instructions, when executed by the one or more processors, further cause the system to:

receive a set of dimension data generated using at least one of: (i) scanning electron microscopy, (ii) transmission electron microscopy, (iii) atomic force microscopy, (iv) optical imaging, or (v) extreme ultraviolet imaging; and execute the dimensioning algorithm to determine the one or more critical dimensions of the sample based on (i) the one or more properties of the hologram and (ii) the set of dimension data.

19. The system of claim 13, wherein at least one of the one or more critical dimensions of the sample are less than or equal to approximately five nanometers (nm), and at least one of the one or more critical dimensions of the sample are less than or equal to approximately 0.5 nm.

20. A non-transitory computer-readable storage medium including instructions for improved critical dimension metrology that, when executed by one or more processors, cause the one or more processors to:

receive a signal generated from a reference beam and a portion of a set of scattered beams that passed through a sample, wherein the reference beam and the portion of the set of scattered beams are superimposed as a hologram of the sample to encode structural information associated with at least one lithographic pattern of one or more lithographic patterns included on the sample;

execute a dimensioning algorithm configured to:

determine one or more critical dimensions of the sample based on one or more properties of the hologram, and reconstruct a real-space image of the sample based on the hologram; and cause the one or more critical dimensions or the real-space image to be displayed for viewing by a user.

* * * * *